United States Patent
Fu et al.

(10) Patent No.: US 11,735,667 B2
(45) Date of Patent: *Aug. 22, 2023

(54) SEMICONDUCTOR DEVICE AND METHOD

(71) Applicant: Taiwan Semiconductor Manufacturing Co., Ltd., Hsinchu (TW)

(72) Inventors: Ching-Feng Fu, Taichung (TW); Guan-Ren Wang, Hsinchu (TW); Yun-Min Chang, Hsinchu (TW); Yu-Lien Huang, Jhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/832,930

(22) Filed: Jun. 6, 2022

(65) Prior Publication Data

US 2022/0302298 A1   Sep. 22, 2022

Related U.S. Application Data

(63) Continuation of application No. 16/917,306, filed on Jun. 30, 2020, now Pat. No. 11,355,637.

(51) Int. Cl.
| | | |
|---|---|---|
| *H01L 29/78* | (2006.01) | |
| *H01L 29/06* | (2006.01) | |
| *H01L 21/768* | (2006.01) | |
| *H01L 21/8234* | (2006.01) | |
| *H01L 29/66* | (2006.01) | |

(52) U.S. Cl.
CPC ........ *H01L 29/785* (2013.01); *H01L 21/7682* (2013.01); *H01L 21/823431* (2013.01); *H01L 29/0649* (2013.01); *H01L 29/66795* (2013.01); *H01L 2029/7858* (2013.01)

(58) Field of Classification Search
CPC .............. H01L 29/785; H01L 29/0649; H01L 2029/7858; H01L 29/0653; H01L 21/7682
See application file for complete search history.

(56) References Cited

U.S. PATENT DOCUMENTS

| | | | |
|---|---|---|---|
| 9,716,158 B1* | 7/2017 | Cheng ............. | H01L 21/823821 |
| 10,128,334 B1 | 11/2018 | Bourjot et al. | |
| 10,734,280 B2 | 8/2020 | Yim et al. | |
| 10,886,378 B2 | 1/2021 | Xie et al. | |
| 11,355,637 B2* | 6/2022 | Fu ....................... | H01L 21/7682 |
| 2015/0263160 A1 | 9/2015 | Xie et al. | |
| 2017/0179242 A1* | 6/2017 | Chang .................. | H01L 29/401 |
| 2018/0122898 A1* | 5/2018 | Park .................... | H01L 29/0649 |

(Continued)

FOREIGN PATENT DOCUMENTS

| | | |
|---|---|---|
| DE | 102019110004 A1 | 4/2020 |
| DE | 102019218267 A1 | 7/2020 |

(Continued)

*Primary Examiner* — Changhyun Yi
(74) *Attorney, Agent, or Firm* — Slater Matsil, LLP

(57) ABSTRACT

A semiconductor device and method of manufacture are provided which help to support contacts while material is removed to form air gaps. In embodiments a contact is formed with an enlarged base to help support overlying portions of the contact. In other embodiments a scaffold material may also be placed prior to the formation of the air gaps in order to provide additional support.

20 Claims, 22 Drawing Sheets

(56) References Cited

U.S. PATENT DOCUMENTS

| | | |
|---|---|---|
| 2018/0130899 A1 | 5/2018 | Zhang et al. |
| 2019/0172752 A1 | 6/2019 | Hsu et al. |
| 2019/0333820 A1 | 10/2019 | Chang et al. |
| 2019/0334008 A1 | 10/2019 | Chen et al. |
| 2020/0075417 A1 | 3/2020 | Lee et al. |
| 2020/0105867 A1 | 4/2020 | Lee et al. |
| 2020/0105909 A1 | 4/2020 | Wu et al. |
| 2020/0126865 A1 | 4/2020 | Huang et al. |
| 2020/0135591 A1 | 4/2020 | Yeong et al. |

FOREIGN PATENT DOCUMENTS

| | | |
|---|---|---|
| KR | 20190056163 A | 5/2019 |
| KR | 20190125910 A | 11/2019 |
| TW | 201911425 A | 3/2019 |

\* cited by examiner

US 11,735,667 B2

SEMICONDUCTOR DEVICE AND METHOD

PRIORITY CLAIM AND CROSS-REFERENCE

This application is a continuation of U.S. patent application Ser. No. 16/917,306, filed on Jun. 30, 2020, and entitled "Semiconductor Device and Method," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
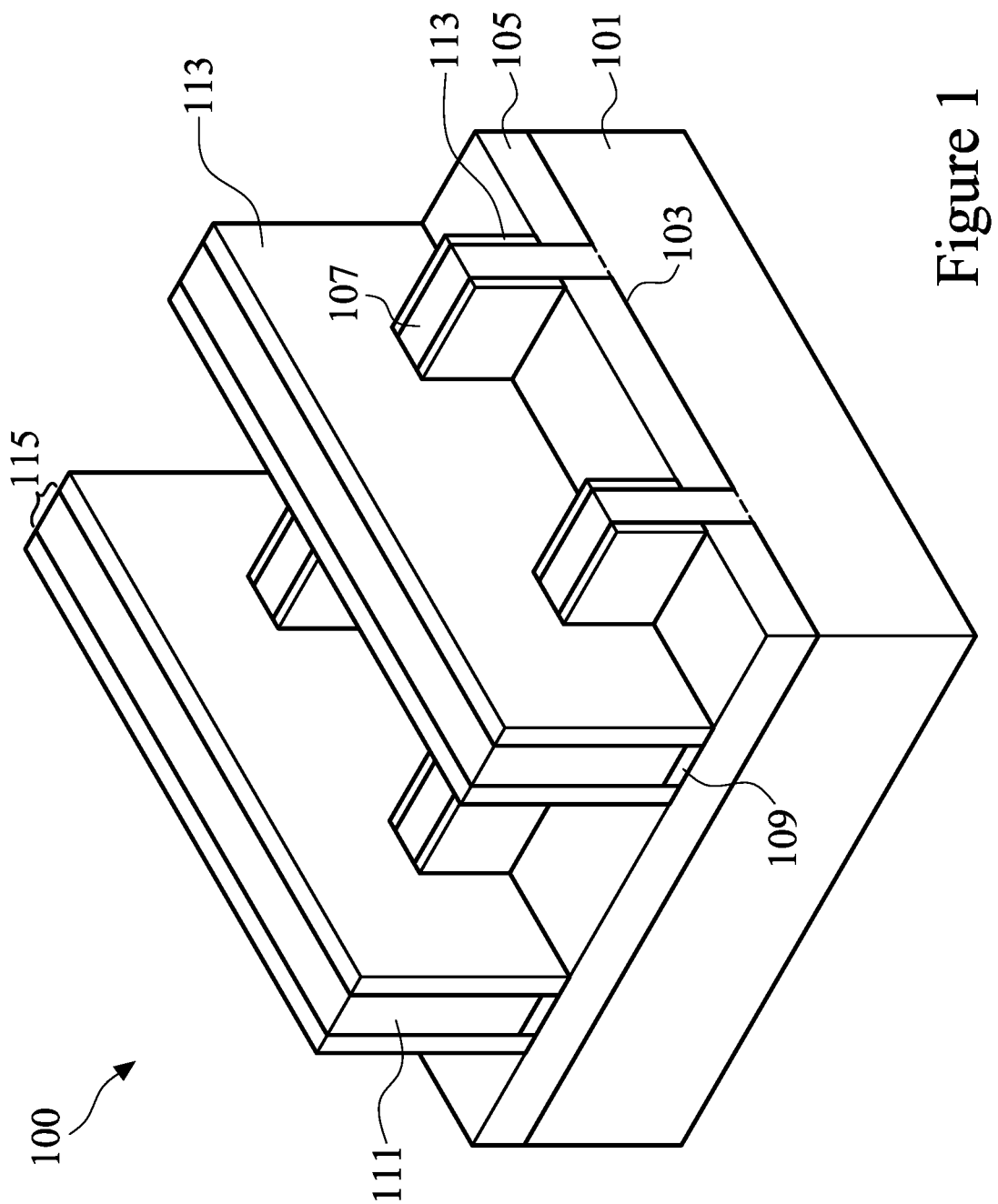
FIG. 1 illustrates steps in a process of forming a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates two fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å, such as about 50 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Additionally, and optionally, if desired, the first isolation regions 105 and the underlying substrate 101 may be further patterned to provide additional isolation between devices. In one particular embodiment (not illustrated in FIG. 1 for clarity but which can be seen in FIG. 12D below), the first isolation regions 105 and the underlying substrate 101 may be etched to form crowns, wherein each crown of the substrate 101 has multiples fins 107, such as two fins 107. In an embodiment the substrate 101 may be patterned using a photolithographic masking and etching process, although any suitable patterning process may be utilized.

Figure 2:
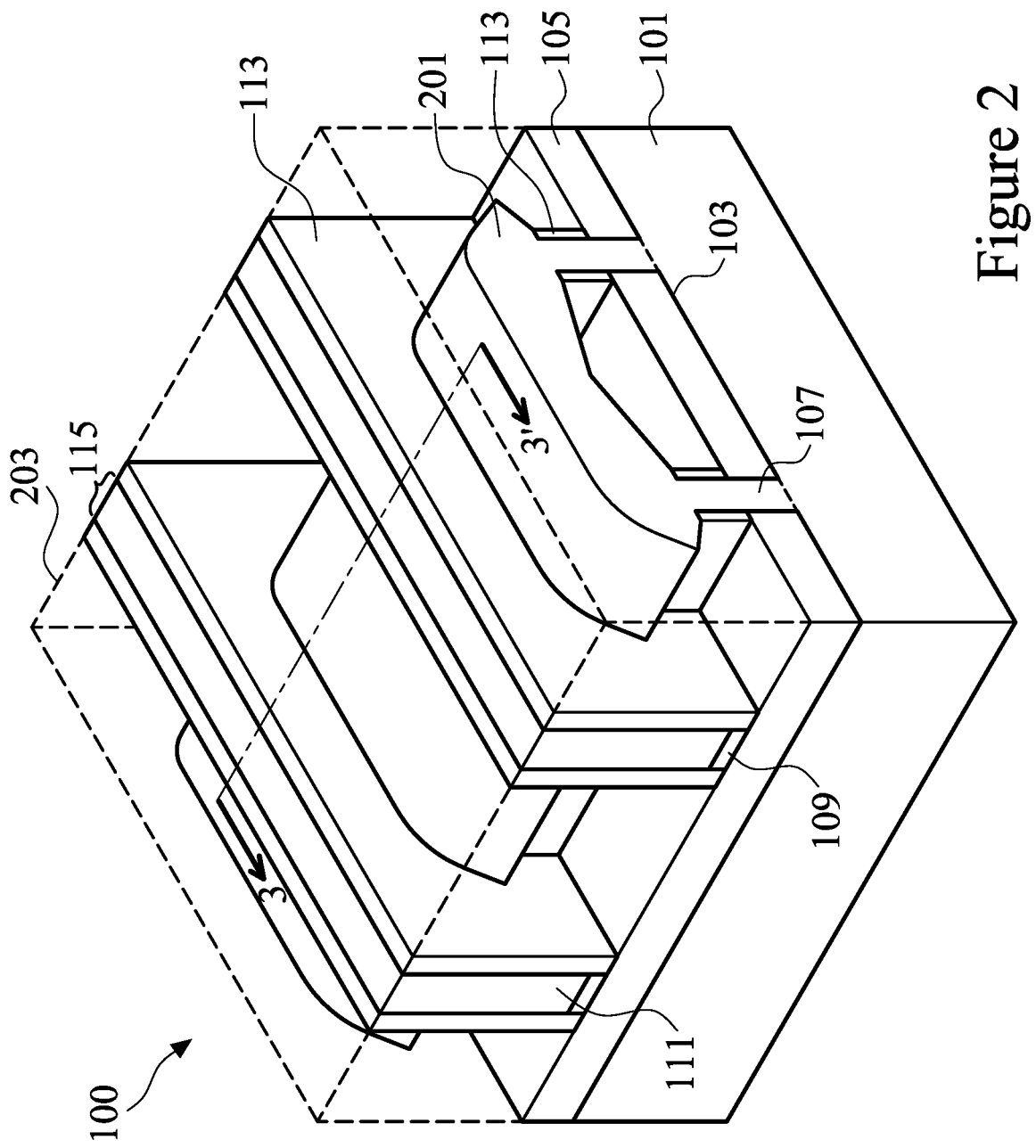
FIG. 2 illustrates formation of source/drain regions in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks. However, any suitable process may be utilized.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. In other embodiments the source/drain regions 201 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å, and may have a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Optionally, if desired, a first etch stop layer 202 (not illustrated in FIG. 2 for clarity but illustrated below with respect to FIG. 3) may be formed over the structure prior to the deposition of the ILD layer 203 (e.g., over the source/drain regions 201. In one embodiment, the first etch stop layer 202 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 202, such as low pressure CVD (LPCVD), PVD, or the like, could alternatively be used. The first etch stop layer 202 may have a thickness of between about 5 Å and about 200 Å or between about 5 Å and about 50 Å.

Figure 3:
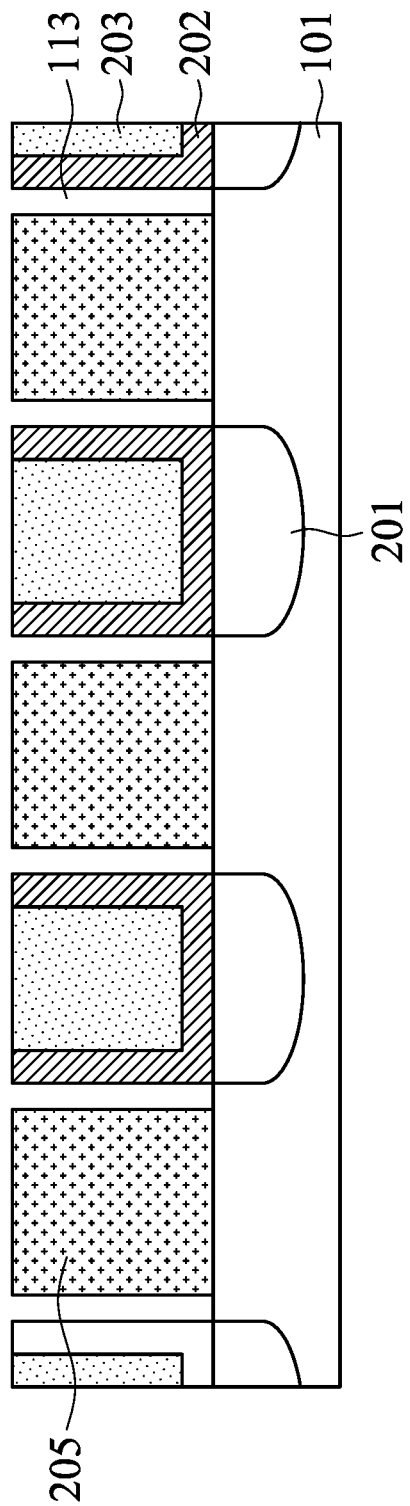
FIG. 3 illustrates a cross sectional view of FIG. 2 in accordance with some embodiments.

FIG. 3 illustrates a cross sectional view of the structure of FIG. 2 along line 3-3' while also showing additional structures not illustrated in FIG. 2, and also illustrates that, after the formation of the first etch stop layer 202 and the ILD layer 203, the material of the dummy gate electrode 111 and the dummy gate dielectric 109 may be removed and replaced to form a gate stack 205. In an embodiment the dummy gate electrode 111 may be removed using, e.g., a wet or dry etching process that utilizes etchants that are selective to the material of the dummy gate electrode 111. However, any suitable removal process may be utilized.

Once the dummy gate electrode 111 has been removed, the openings left behind may be refilled to form a gate stack 205. In a particular embodiment the gate stack 205 comprises a first dielectric material, a first metal material, a second metal material, and a third metal material. In an embodiment the first dielectric material is a high-k material such as $HfO_2$, HfSiO, HfSiON, HfTaO, HfTio, HfZrO, LaO, ZrO, layer deposition, chemical vapor deposition, or the like. The first dielectric material may be deposited to a thickness of between about 5 Å and about 200 Å, although any suitable material and thickness may be utilized.

The first metal material may be formed adjacent to the first dielectric material and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The second metal material may be formed adjacent to the first metal material and, in a particular embodiment, may be similar to the first metal material. For example, the second metal material may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material may be deposited using a deposition process such as atomic layer deposition, chemical vapor deposition, sputtering, or the like, to a thickness of between about 5 Å and about 200 Å, although any suitable deposition process or thickness may be used.

The third metal material fills a remainder of the opening left behind by the removal of the dummy gate electrode 111. In an embodiment the third metal material is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

Optionally, after the materials of the gate stack 205 have been formed and planarized, the materials of the gate stack 205 may be recessed and capped with a capping layer (not separately illustrated). In an embodiment the materials of the gate stack 205 may be recessed using, e.g., a wet or dry etching process that utilizes etchants selective to the materials of the gate stack 205. In an embodiment the materials of the gate stack 205 may be recessed a distance of between about 5 nm and about 150 nm, such as about 120 nm. However, any suitable process and distance may be utilized.

Once the materials of the gate stack 205 have been recessed, the capping layer may be deposited and planarized with the first spacers 113. In an embodiment the capping layer is a material such as SiN, SiON, SiCON, SiC, SiOC, combinations of these, or the like, deposited using a deposition process such as atomic layer deposition, chemical vapor deposition, sputtering, or the like. The capping layer may be deposited to a thickness of between about 5 Å and about 200 Å, and then planarized using a planarization process such as chemical mechanical polishing such that the capping layer is planar with the first spacers 113.

Additionally at this stage, or at any other suitable stage of manufacture, a cut metal gate process may be utilized to form a cut metal gate region 1105, which process is not seen in FIG. 3 but which can be seen further below with respect to FIG. 11B. In such a process a portion of the materials of the gate stacks 205 may be removed in order to separate one portion of the gate stacks 205 from another portion of the gate stacks 205, effectively forming two separate gates. In an embodiment the removal process may be performed using a photolithographic masking process followed by one or more etching processes.

Once the removal processes have removed the desired portions of the gate stacks 205 and formed separate gate structures, the opening left behind by the removal may be filled. In an embodiment the opening may be filled and/or overfilled with a dielectric material such as silicon oxide, silicon nitride, silicon oxynitride, a high-k dielectric material, combinations of these or the like. Once deposited, the material may be planarized using, for example, a chemical mechanical polishing process.

Figure 4:
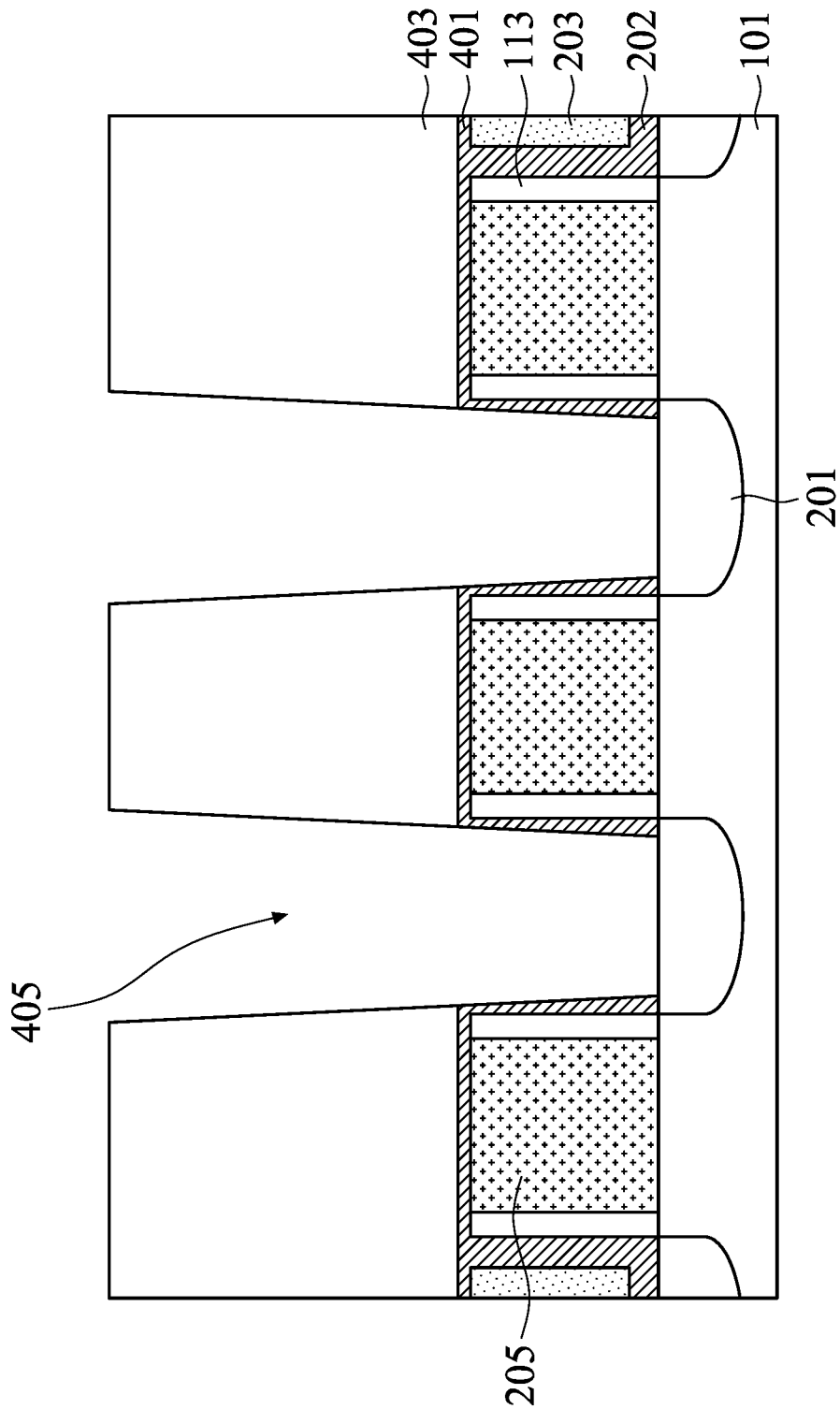
FIG. 4 illustrates formation of an interlayer dielectric in accordance with some embodiments.

FIG. 4 illustrates a formation of a second etch stop layer 401 over the gate stacks 205. In one embodiment, the second etch stop layer 401 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the second etch stop layer 401, such as low pressure CVD (LPCVD), PVD, or the like, could be used. The second etch stop layer 401 may have a thickness of between about 5 Å and about 200 Å or between about 5 Å and about 50 Å.

FIG. 4 additionally illustrates a formation of a second ILD layer 403. The second ILD layer 403 may comprise an oxide material such as SiON, SiCON, SiC, SiOC, $SiC_xN_y$, $SiO_x$, although any other suitable materials, such as boron phosphorous silicate glass (BPSG), although any suitable dielectrics may be used. The second ILD layer 403 may be formed using a process such as PECVD, although other processes, such as LPCVD, may alternatively be used. The second ILD layer 403 may be formed to a thickness of between about 70 Å and about 3,000 Å, such as 700 Å. Once formed, the second ILD layer 403 may be planarized using, e.g., a planarization process such as a chemical mechanical polishing process, although any suitable process may be utilized.

FIG. 4 additionally illustrates a formation of a first opening 405 through the second ILD layer 403, the second etch stop layer 401, through the ILD layer 203, and through the first etch stop layer 202 in order to expose the source/drain regions 201 in preparation for formation of a first contact 901 (not illustrated in FIG. 4 but illustrated and described below with respect to FIG. 9). In an embodiment the first opening 405 may be formed by initially placing and patterning a photoresist over the source/drain regions 201. In an embodiment the photoresist is a tri-layer photoresist, with a bottom anti-reflective coating (BARC) layer, an intermediate mask layer, and a top photoresist layer. However, any suitable type of photosensitive material or combination of materials may be utilized.

Once the photoresist has been placed, the photoresist is patterned. In an embodiment the photoresist may be patterned by exposing a photosensitive material within the photoresist (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the photoresist are different from the physical properties of the unexposed portions of the photoresist. The photoresist may then be developed with, e.g., a developer (not separately illustrated), in order to separate the exposed portion of the photoresist from the unexposed portion of the photoresist.

In an embodiment the photoresist is patterned to form an opening that exposes the second ILD layer 403. Once the photoresist has been patterned, the first opening 405 may be formed using the photoresist as a mask. In an embodiment the first opening 405 may be formed using one or more reactive ion etching processes to form the first opening 405 through the second ILD layer 403, the second etch stop layer 401, and the ILD layer 203. Additionally, the first opening 405 will also be formed to extend through a bottom portion of the second etch stop layer 202 and expose the source/drain regions 201 while still leaving a portion of the second etch stop layer 202 along sidewalls of the first opening 405. However, any suitable processes may be utilized to form the first opening 405.

Once the first opening 405 has been formed, the photoresist may be removed. In an embodiment the photoresist may be removed using, e.g., an ashing process, whereby a temperature of the photoresist is increased until the photoresist undergoes a thermal decomposition, at which point the photoresist may be easily removed. However, any suitable removal process, such as a wet etch, may also be utilized.

Figure 5:
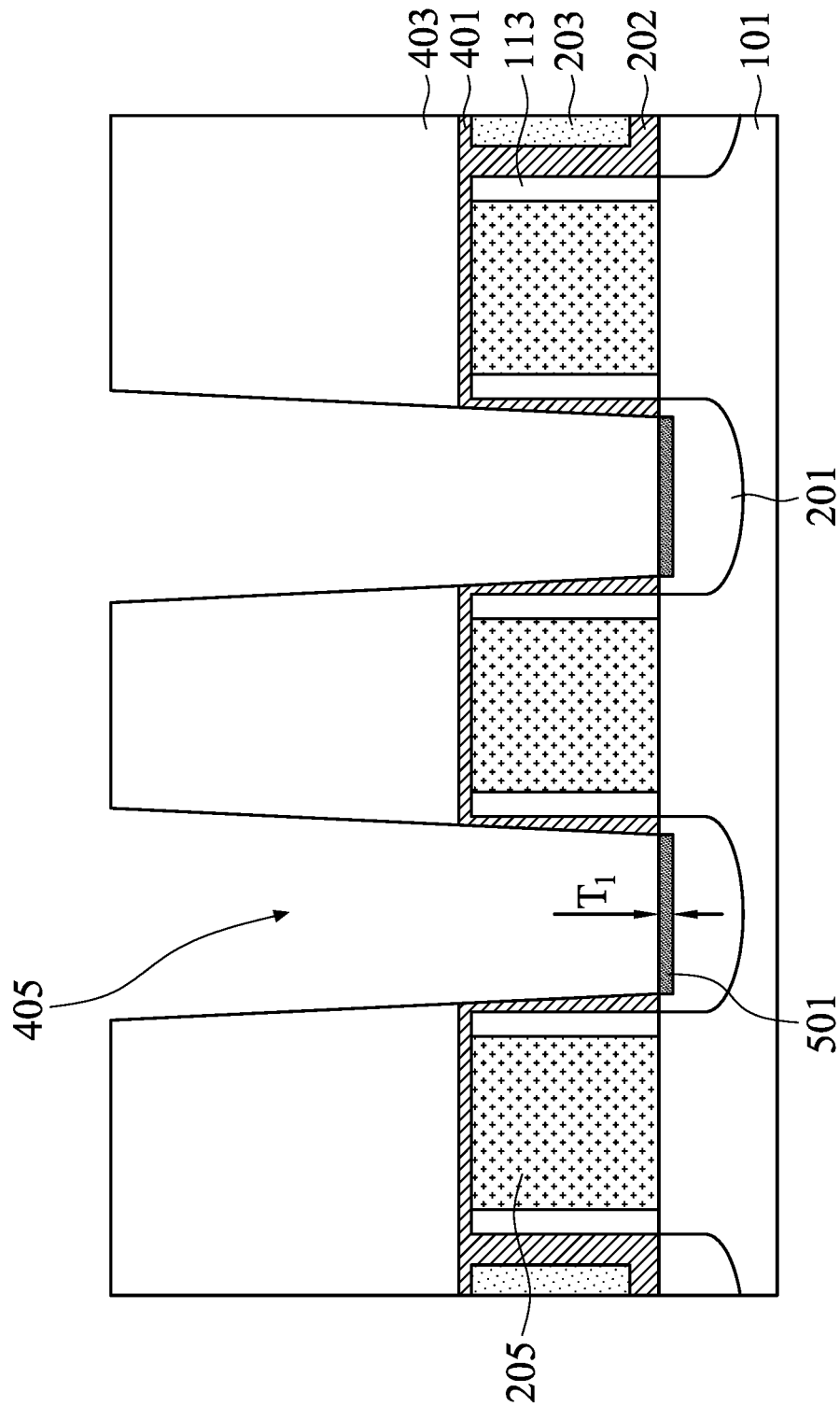
FIG. 5 illustrates a formation of a base layer in accordance with some embodiments.

FIG. 5 illustrates a formation of a base layer 501 within the first opening 405 and adjacent to the source/drain regions 201. In an embodiment the base layer 501 may be a material such as an oxide material such as silicon oxide, silicon germanium oxide, or germanium oxide. However, any suitable material may be used.

In an embodiment the base layer 501 may be formed such that the base layer 501 is located along a bottom of the first opening 405 and leaves room within the first opening 405 for the formation of the first contact 901. In an embodiment the base layer 501 may be formed as a native oxide material, whereby the exposed material of the underlying source/drain regions 201 is oxidized either intentionally or through an exposure to an oxygen containing ambient atmosphere to form the oxide material. In an embodiment in which the exposed material is intentionally oxidized, the oxidation can occur through a process such as an ion bombardment with oxygen followed by an ashing process in an ambient air environment. As such, the base layer 501 is formed adjacent to the source/drain regions 201 along a bottom of the first opening 405.

However, while multiple oxidation processes for forming the base layer 501 within the first opening 405 have been described, these are intended to be illustrative and are not intended to be limiting. Rather, any suitable method of forming the base layer 501 may be utilized. All such methods are fully intended to be included within the scope of the embodiments.

In an embodiment the base layer 501 may be formed to a thickness sufficient to provide structural support for subsequently manufactured structures (described further below). As such, in some embodiments the base layer 501 may be formed to a first thickness $T_1$ of between about 5 Å and about 50 Å, such as about 20 Å to 40 Å. However, any suitable thicknesses may be utilized.

Figure 6:
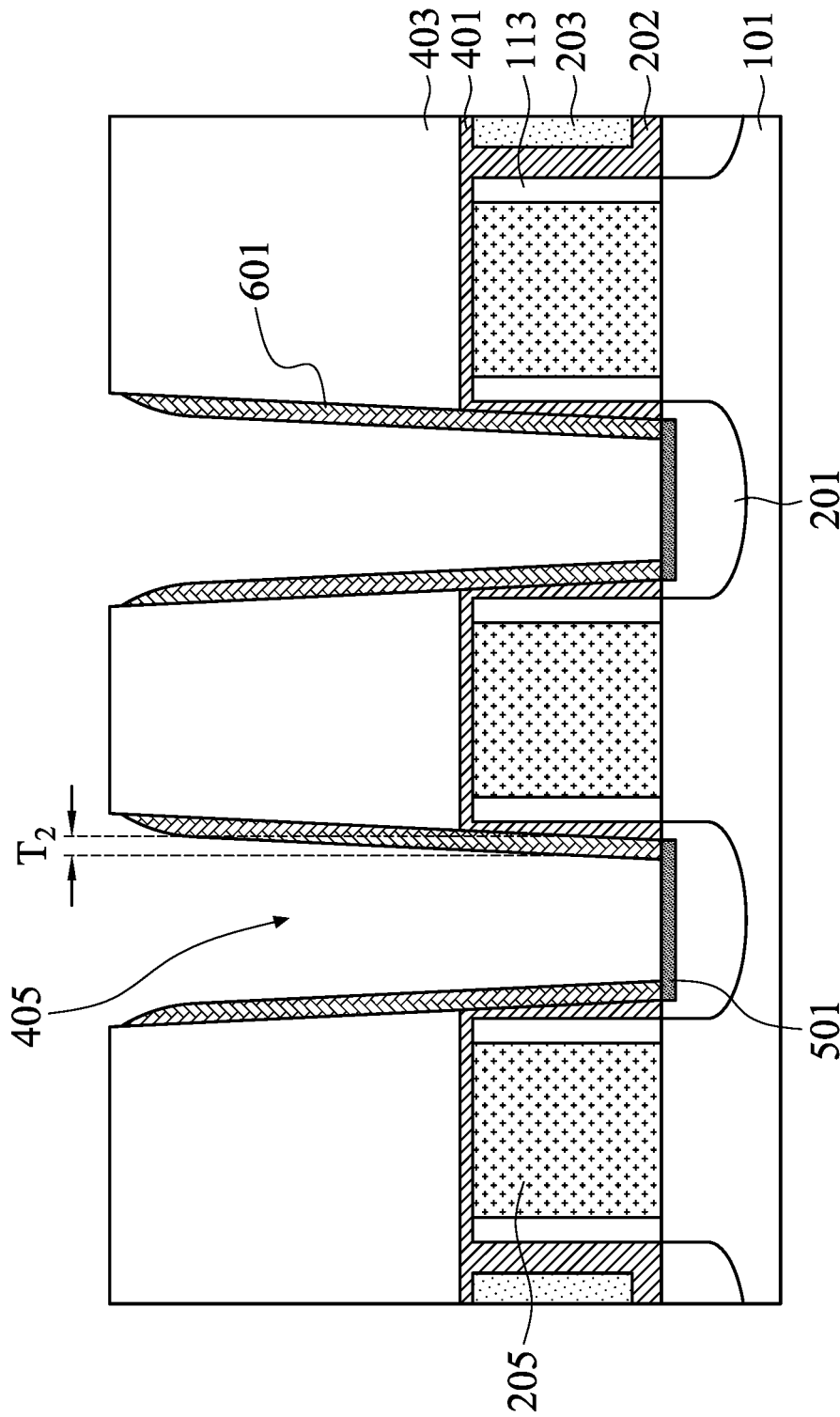
FIG. 6 illustrates a formation of a sacrificial layer in accordance with some embodiments.

FIG. 6 illustrates a formation of sacrificial spacers 601 within the first openings 405 and over the base layer 501. In an embodiment the sacrificial spacers 601 are formed from a material such as silicon, SiGe, SiC, SiP, SiCP, combinations of these, or the like, although any suitable materials may be utilized. The sacrificial spacers 601 may be formed by initially forming a sacrificial spacer layer (not separately illustrated) using a deposition method such as chemical vapor deposition (CVD), plasma enhanced CVD, sputter, and other methods known in the art. The sacrificial spacers 601 may then be patterned, such as by one or more anisotropic etches (e.g., one or more reactive ion etches) to remove the sacrificial spacer layer from the horizontal surfaces of the structure, to form the sacrificial spacers 601.

In an embodiment the sacrificial spacers 601 may be formed to have a second thickness $T_2$ that is sufficient to provide an air-gap 1001 (not illustrated in FIG. 6 but illustrated and discussed further below with respect to FIG. 10A) for electrical isolation. As such, the second thickness $T_2$ may be between about 10 Å and about 60 Å, such as about 20 Å to 30 Å. However, any suitable thickness may be utilized.

Figure 7:
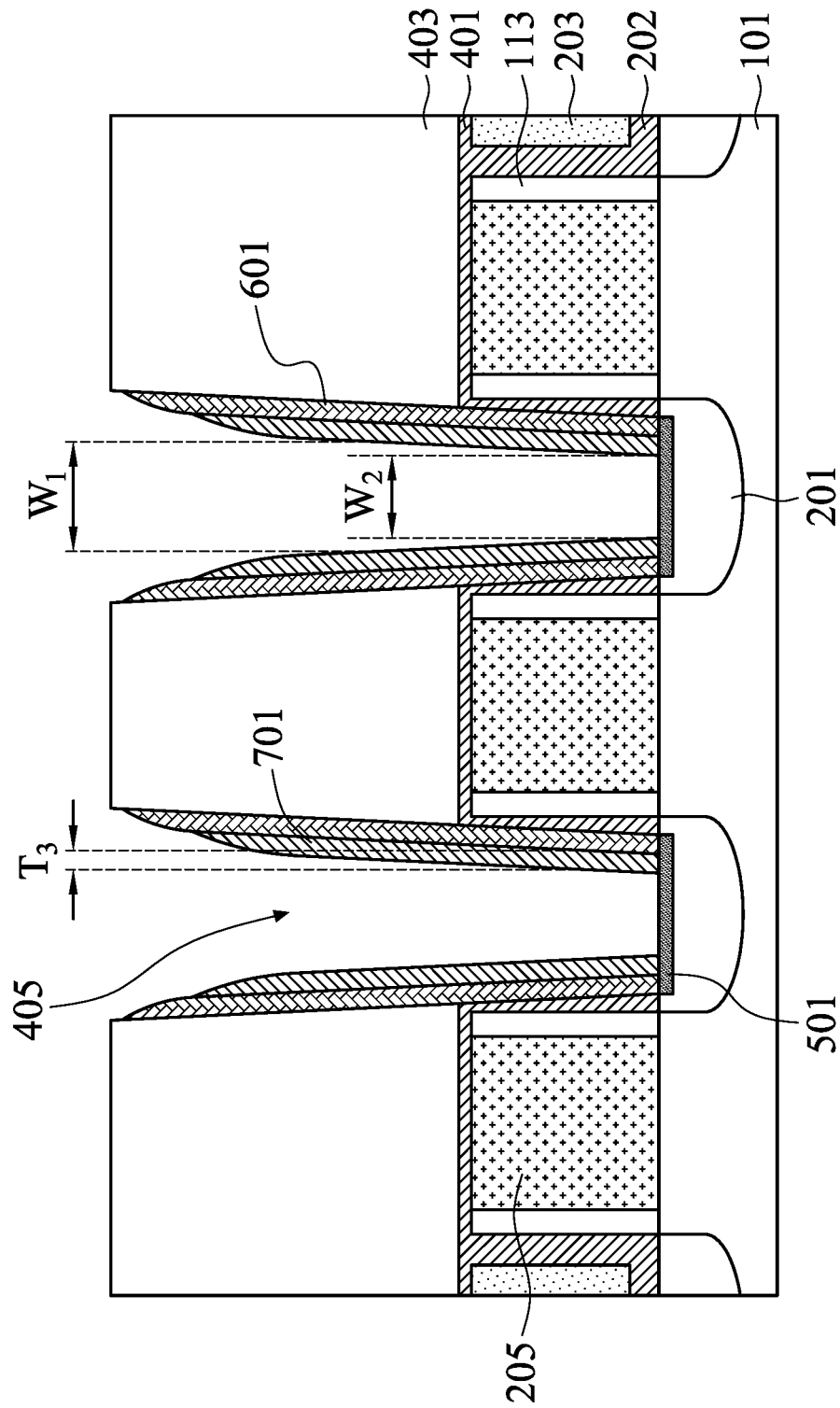
FIG. 7 illustrates a formation of spacers in accordance with some embodiments.

FIG. 7 illustrates a deposition of a second spacer 701 adjacent to the sacrificial spacers 601 within the first openings 405. In an embodiment, the second spacers 701 are formed by blanket depositing a second spacer layer (not separately illustrated in FIG. 7) on the previously formed structure. The second spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The second spacers 701 may then be patterned, such as by one or more anisotropic etches (e.g., one or more reactive ion etches) to remove the second spacer layer from the horizontal surfaces of the structure, to form the second spacers 701.

In an embodiment the second spacer 701 may be formed to have a third thickness $T_3$ that is sufficient to work with the air-gap 1001 to help electrically isolate the subsequently formed first contact 901. As such, the third thickness $T_3$ may be between about 10 Å and about 60 Å, such as about 20 Å to 30 Å. However, any suitable thickness may be utilized.

After the second spacers 701 have been formed, the first openings 405 have been reduced in width from the original sizes of the first openings 405. Additionally, in embodiments in which reactive ion etches were utilized to form the sacrificial spacers 601 and the second spacers 701, an upper width of the first openings 405 may be larger than a lower width of the first openings 405. For example, in some embodiments the first openings 405 may have a first width $W_1$ along an upper surface of the second ILD layer 403 of between about 10 nm and about 60 nm, such as about 17 nm, and may also have a second width $W_2$ adjacent to the base layer 501 that is less than the first width $W_1$. In an embodiment the second width $W_2$ may be less than the first width $W_1$ by between about 0 and about 5, such as about 2 nm. For example, the second width $W_2$ may be between about 10 nm and about 60 nm, such as about 15 nm. However, any suitable widths may be utilized.

Figure 8:
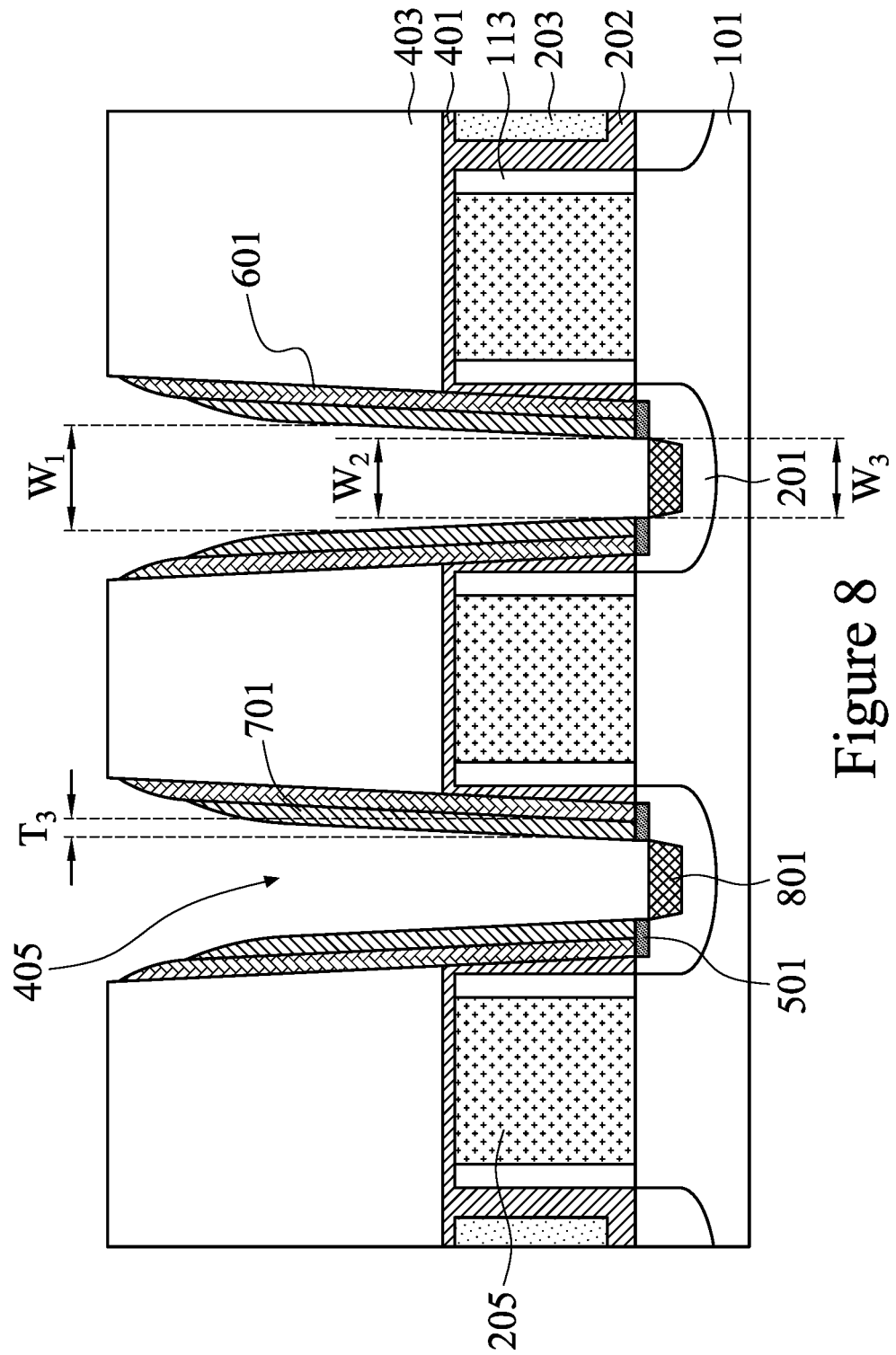
FIG. 8 illustrates a patterning of the base layer in accordance with some embodiments.

FIG. 8 illustrates a patterning of the base layer 501 through the second spacers 701. In an embodiment the base layer 501 may be patterned using an etching process such as an anisotropic dry etch process with etchants selective to the material of the base layer 501 without significant removal of the material of the second spacers 701. In an embodiment in which the material of the base layer 501 is a native oxide and the material of the second spacers 701 is silicon nitride, an etching system such as a charge coupled plasma anisotropic etching system may be utilized.

By patterning the base layer 501 with an anisotropic etching system, a very smooth spacer profile is achieved. Further, the opening through the base layer 501 will be aligned with the sides of the second spacers 701, such that the first opening 405 through the base layer 501 will have a third width W3 that is equal to the second width $W_2$. However, any suitable widths may be utilized.

FIG. 8 additionally illustrates an optional formation of silicide contacts 801 within the source/drain regions 201. The silicide contacts 801 may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process, thereby leaving the silicide contacts 801 to have sidewalls which are aligned with sidewalls of the base layer 501. The thickness of the silicide contacts 801 may be between about 5 Å and about 2000 Å.

Figure 9:
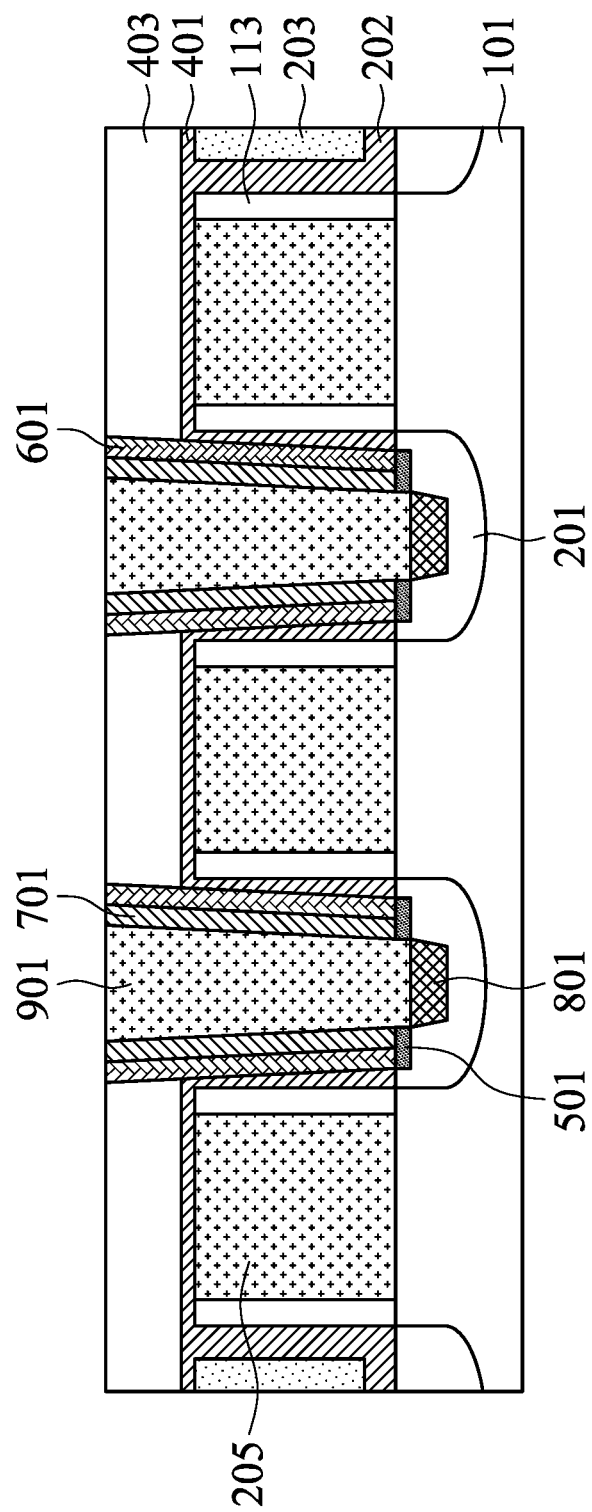
FIG. 9 illustrates a formation of a first contact in accordance with some embodiments.

FIG. 9 illustrates that, once the silicide contacts 801 have been formed, a first contact 901 is formed. In an embodiment the first contact 901 may be a conductive material such as Co, Al, Cu, W, Ti, Ta, Ru, TiN, TiAl, TiAlN, TaN, TaC, NiSi, CoSi, alloys of these, combinations of these, or the like, and may be deposited using a bottom-up deposition process such as electroplating, electroless plating, combinations of these, or the like in order to fill and/or overfill the first opening 405. However, any suitable deposition process, such as sputtering, chemical vapor deposition, or the like, may also be utilized.

Once the material of the first contact 901 has been formed to fill and/or overfill the first opening 405, any deposited material outside of the first opening 405 may be removed using a planarization process such as chemical mechanical polishing (CMP). However, any suitable material and process of formation may be utilized. As such, the first contact 901 is planarized to be coplanar with the material of the second ILD layer 403, the second spacers 701 and the sacrificial spacer 601.

Additionally, in some embodiments the planarization process may be further used in order to reduce the height of the second ILD layer 403 and remove any chapping profiles or other defects. In some embodiments the height of the second ILD layer 403 may be reduced by a distance of about 52 nm, such that the second ILD layer 403 may have an end height of between about 10 nm and about 25 nm, such as about 18 nm. However, any suitable height may be utilized.

Figure 10A:
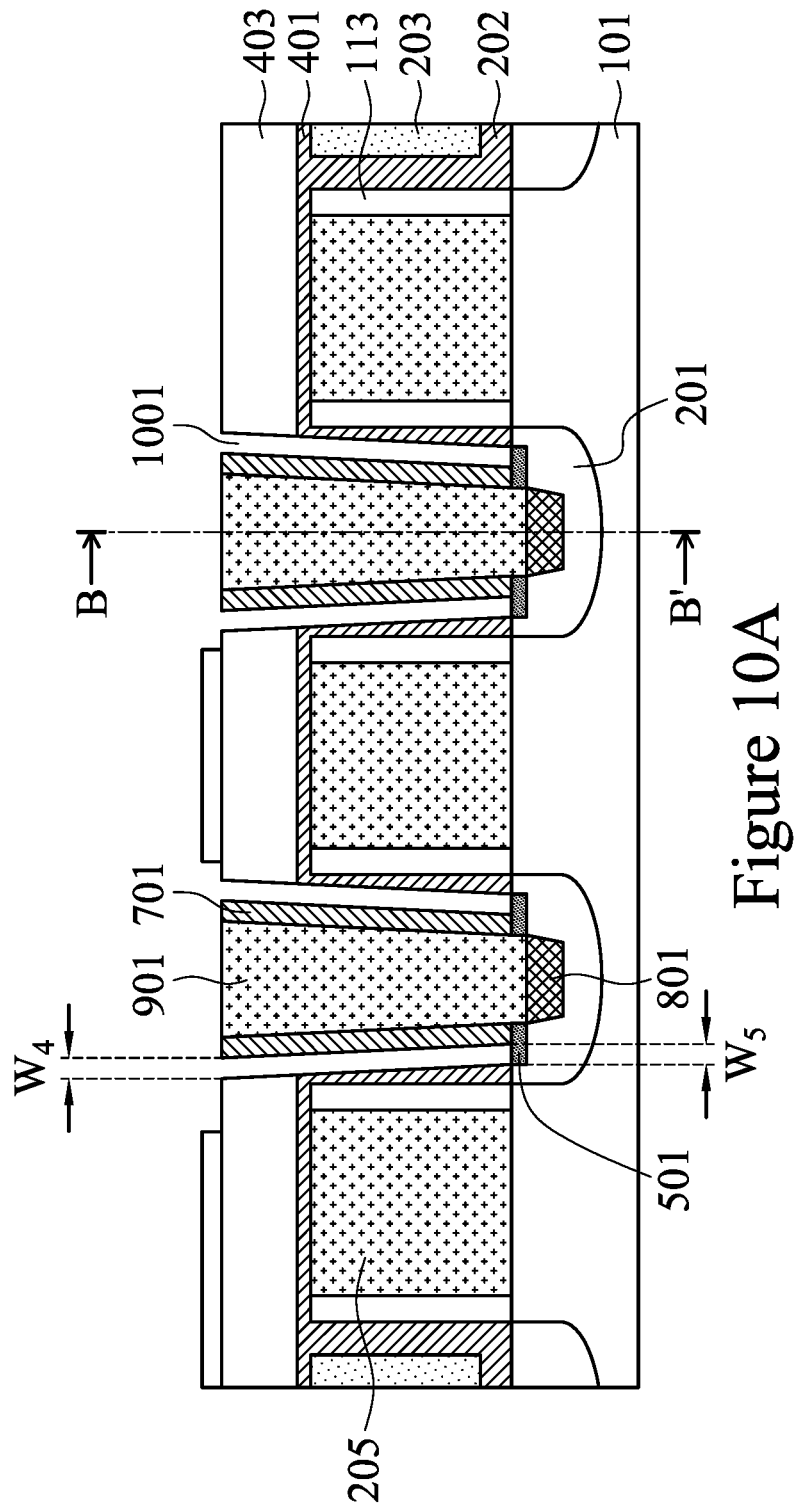
FIGS. 10A-10B illustrate a formation of air gaps in accordance with some embodiments.

FIG. 10A illustrates a removal of the sacrificial spacers 601 to form an air-gap 1001 between the second spacers 701 and the first spacers 113. In an embodiment the sacrificial spacers 601 may be removed using an etching process such as an isotropic etching process that utilizes an etchant selective to the material of the sacrificial spacers 601 without significantly removing material of the second spacers 701 and using the base layer 501 as an etch stop layer. As such, while the precise etchant utilized is dependent at least in part on the materials of the sacrificial spacers 601 and the second spacers 701, in an embodiment in which the sacrificial spacers 601 are silicon and the second spacers 701 are silicon nitride, an isotropic etchant such as $NF_3$, $H_2$, and/or $NH_3$ mixed with an inert gas such as helium may be utilized to remove the sacrificial spacers 601 with a system such as a radical surface treatment system, an isotropic chemical etcher, or the like. However, any suitable etchant or etching process may be utilized.

By depositing the material of the sacrificial spacers 601, patterning the material of the sacrificial spacers 601, and then removing the material of the sacrificial spacers 601, the air-gap 1001 will be formed with differing widths. In an embodiment the air-gap 1001 may have a fourth width $W_4$ along a top surface of the air-gap 1001 adjacent to the second ILD layer 403 of between about 10 Å and about 60 Å, such as about 20 Å to 30 Å. Similarly, the air gap 1001 may have a fifth width $W_5$ adjacent to the base layer 501 of between about 10 Å and about 60 Å, such as about 20 Å to 30 Å. However, any suitable widths may be utilized.

By forming the first contact 901 in the funnel shape wherein the first contact 901 may have a varying width as the first contact 901 extends away from the substrate 101, the first contact 901 may have a larger base and a larger contact interface upon which the first contact 901 will sit upon. As such, when the physical support from the sacrificial spacers 601 is removed to form the air-gap 1001, the first contact 901 will have the additional support of the wider base to help compensate the reduced support from the removal of the sacrificial spacers 601. With such additional support, the first contact 901 is less likely to suffer issues related to weaker structures, such as tilting.

Additionally, the use of the base layer 501 extending between the first contact 901 and the first etch stop layer 202 will also work to reduce tilting of the first contact 901. For example, the base layer 501 will provide additional support to the lower portion of the first contact 901, thereby stabilizing the first contact 901 and reducing the possibility of the first contact 901 tilting due to lack of support.

Figure 10B:
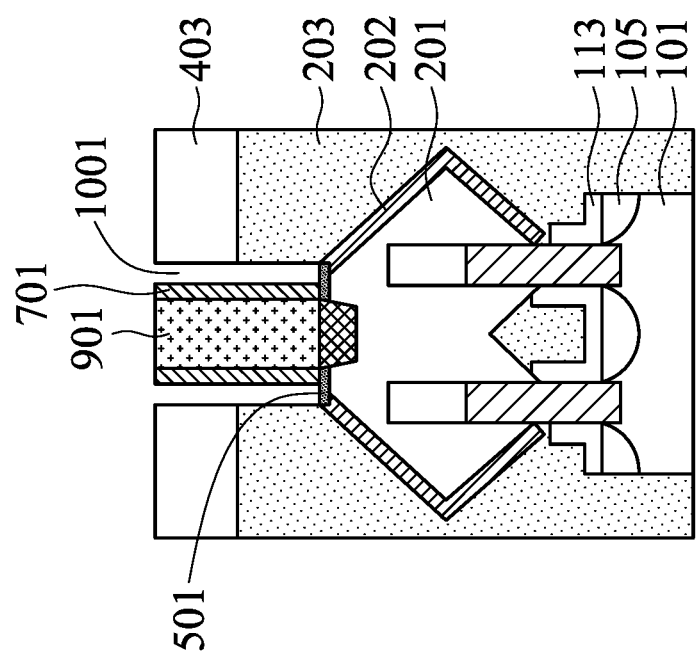

FIG. 10B illustrates a cross-sectional view of the structure of 10A through line B-B', wherein the first contact 901 makes physical connection to a single source/drain region 201. As can be seen, the base layer 501 extends from the first contact 901 to make physical contact with the first etch stop layer 202 and, in some embodiments, the ILD layer 203. The base layer 501 along with the wider bottom of the first contact 901 help to provide additional structural support for the first contact 901 after the air-gaps 1001 have been formed.

Figure 11A:
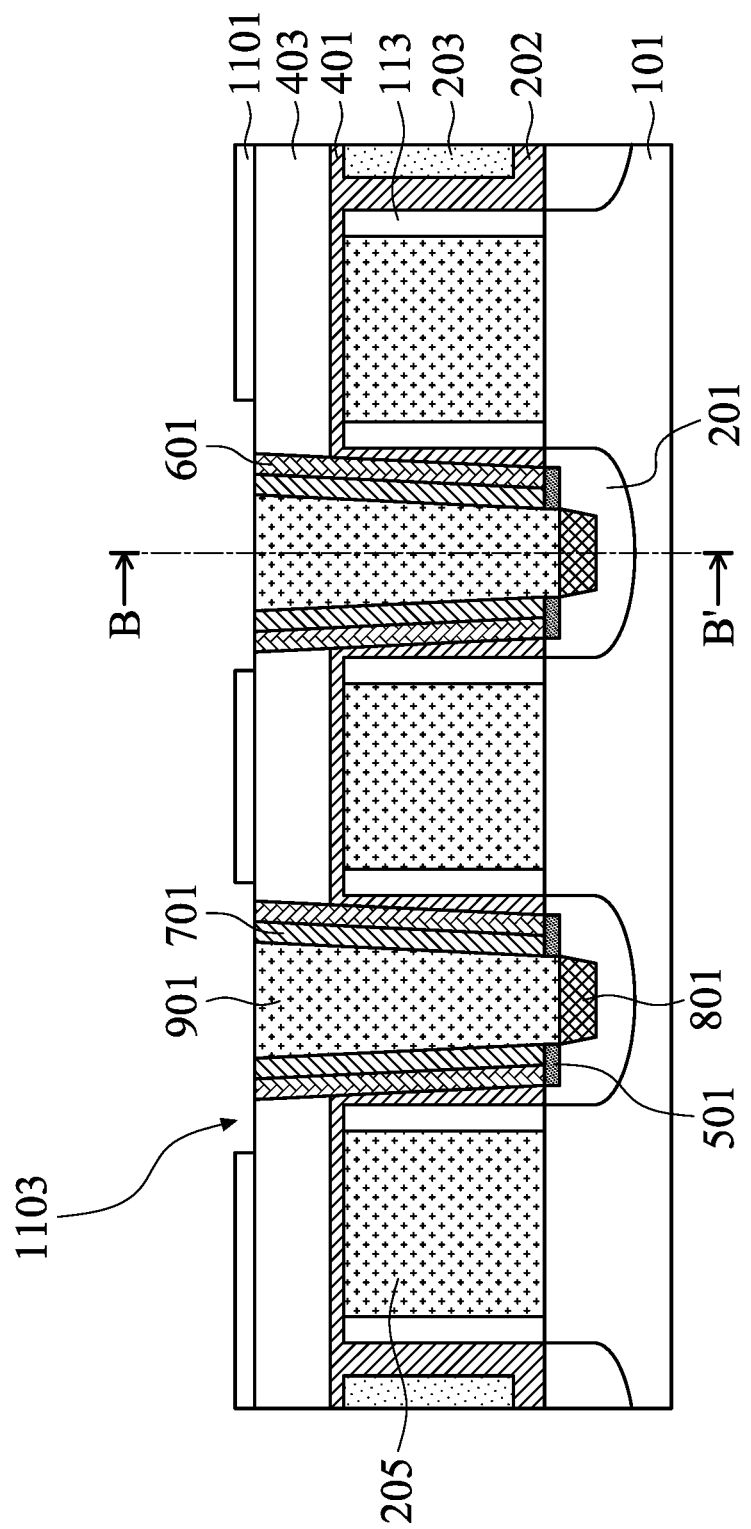
FIGS. 11A-11C illustrate a formation of a scaffold in accordance with some embodiments.
Figure 11B:
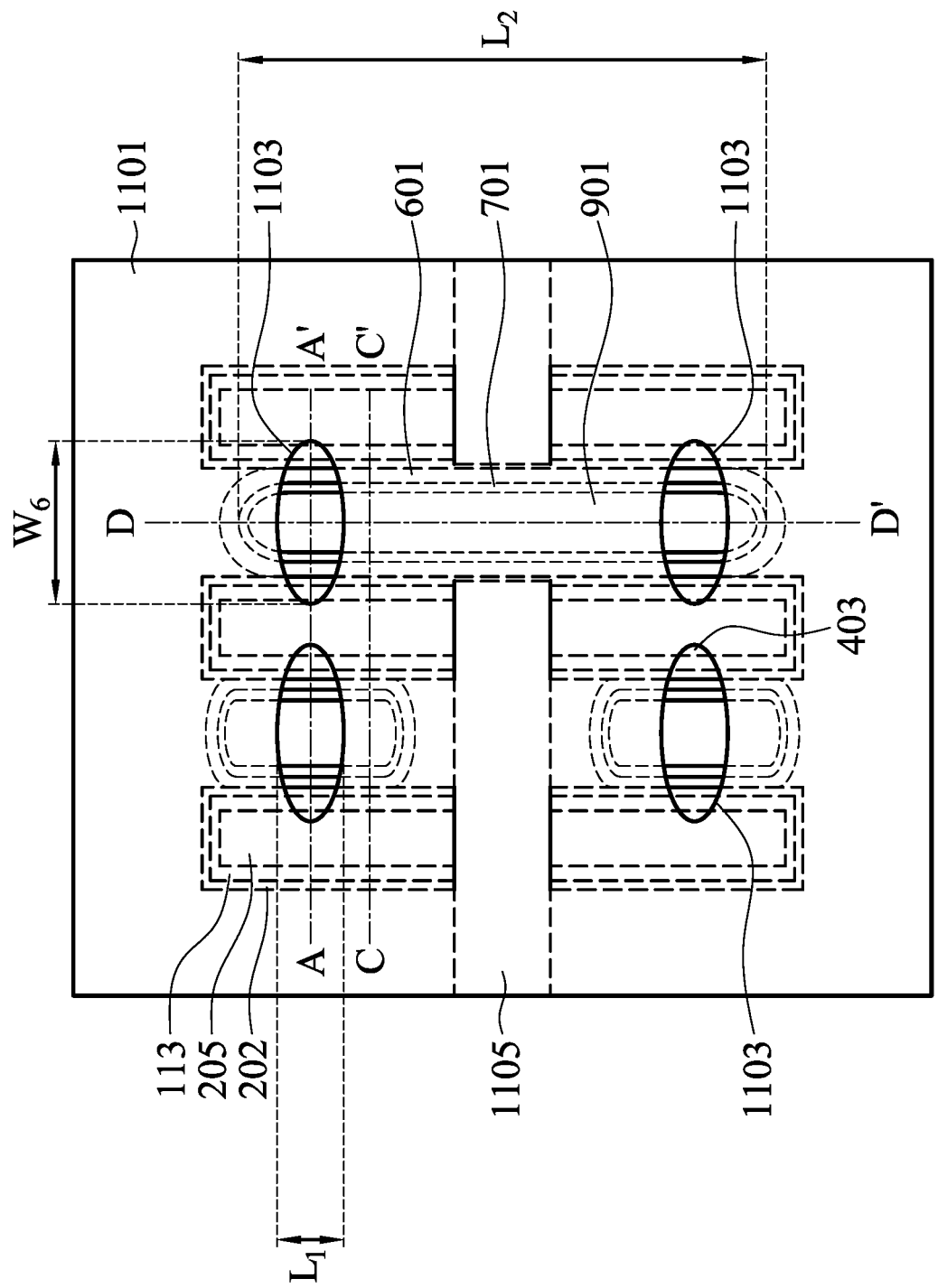
Figure 11C:
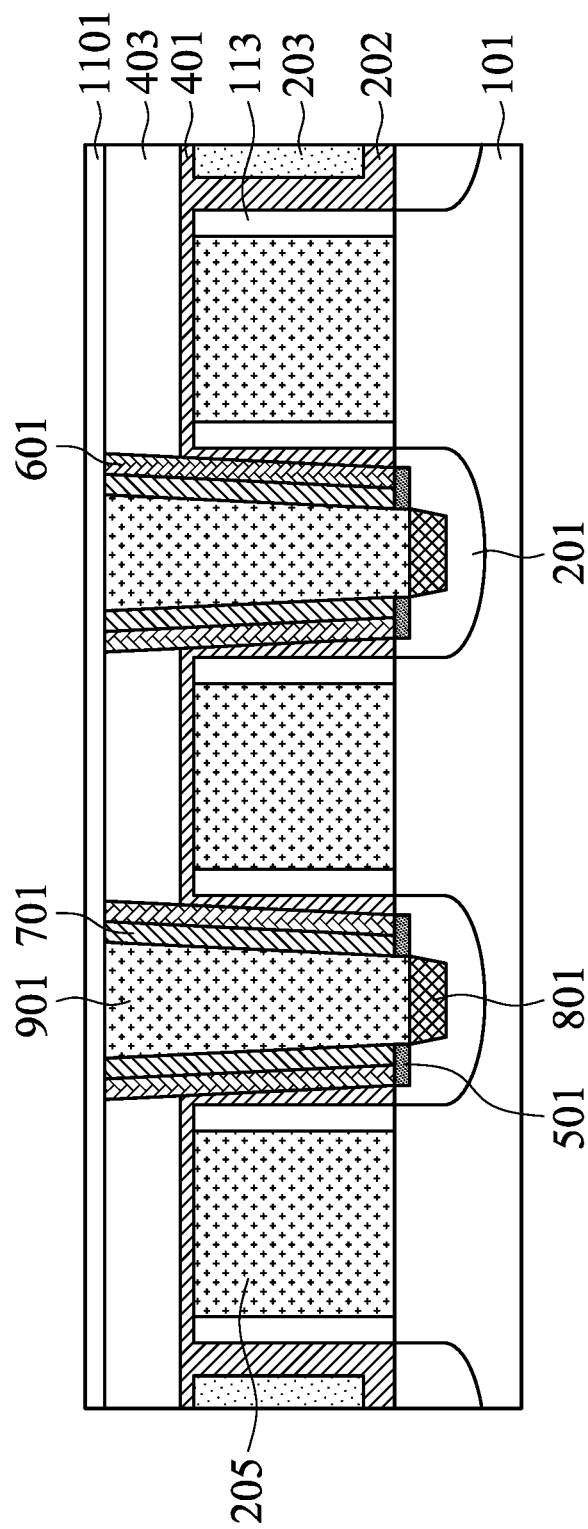

FIGS. 11A-11C illustrate yet another embodiment which may be utilized either by itself or in addition to each of the already described embodiments in order to help prevent tilting of the first contact 901 after removal of the sacrificial spacers 601, with FIG. 11A illustrating a continuation of the process previously described with respect to FIGS. 1-9, FIG. 11B illustrating a top down view of the structure illustrated in FIG. 11A (wherein FIG. 11A is a cross-sectional view of FIG. 11B through line A-A'), and wherein FIG. 11C illustrates another cross-sectional view along line C-C' as illustrated in FIG. 11B. In this embodiment, in addition to, or instead of, supporting the first contact 901 using the base layer 501 or the increased width of the first contact 901, a scaffold 1101 is formed and used to help support the structure of the first contact 901 during and after formation of the air-gap 1001 (not seen in FIGS. 11A-11C but seen and illustrated below with respect to FIGS. 12A-12C).

In an embodiment the scaffold 1101 may be formed over the first contact 901 but before removal of the sacrificial spacer 601 and may be a dielectric material such as silicon nitride, silicon oxide, silicon oxynitride, a low-k dielectric material, combinations of these, or the like. Additionally, the scaffold 1101 may be formed using a deposition process such as chemical vapor deposition, physical vapor deposition, atomic layer deposition, combinations of these, or the like, to a thickness of between about 5 nm and about 200 nm, such as about 10 nm. However, any suitable process and thickness may be utilized.

Once the material of the scaffold 1101 has been blanket deposited, the material of the scaffold 1101 is patterned in order to form second openings 1103 which expose a portion of the top surface of the sacrificial spacers 601 and the first contact 901 (as can be seen in FIG. 11A) but to not expose all of the top surface of the first contact 901 (as can be seen in FIG. 11C). As such, the scaffold 1101 is in place and in physical contact with a portion of the first contact 901 during removal of the sacrificial spacers 601 and is able to provide additional support. In an embodiment the material of the scaffold 1101 may be patterned using, for example, a photolithographic masking and etching process. However, any suitable process may be utilized.

FIG. 11B illustrates that the second opening 1103 may be shaped as an oval. However, illustrating the second opening 1103 as an oval is intended to be illustrative and is not intended to be limiting, as any suitable shape may be utilized for the second opening 1103. For example, the second opening 1103 may be square shaped, shaped as a rectangle, or any other suitable shape. All such shapes are fully intended to be included within the scope of the embodiments.

Additionally, the second openings 1103 may be sized in order to allow for a suitable removal of the sacrificial spacer 601 out of the second openings 1103 (described further below with respect to FIGS. 12A-12C). In a particular embodiment, the second openings 1103 may be formed to have a sixth width W6 of between about 10 nm and about 100 nm, such as about 30 nm, and a first length $L_1$ of between about 10 nm and about 50 nm, such as about 20 nm. However, any suitable widths and lengths may be utilized.

Additionally, in some embodiments multiples one of the second openings 1103 may be formed on a single first contact 901 in order to ensure that there are enough second openings 1103 to remove the sacrificial spacers 601. For example, in an embodiment in which the first contact 901 has a second length L2 of between about 50 nm and about 1000 nm, such as about 100 nm, two second openings 1103 may be formed over the first contact 901 while shorter first contacts 901 may only utilize a single second opening 1103.

Figure 12A:
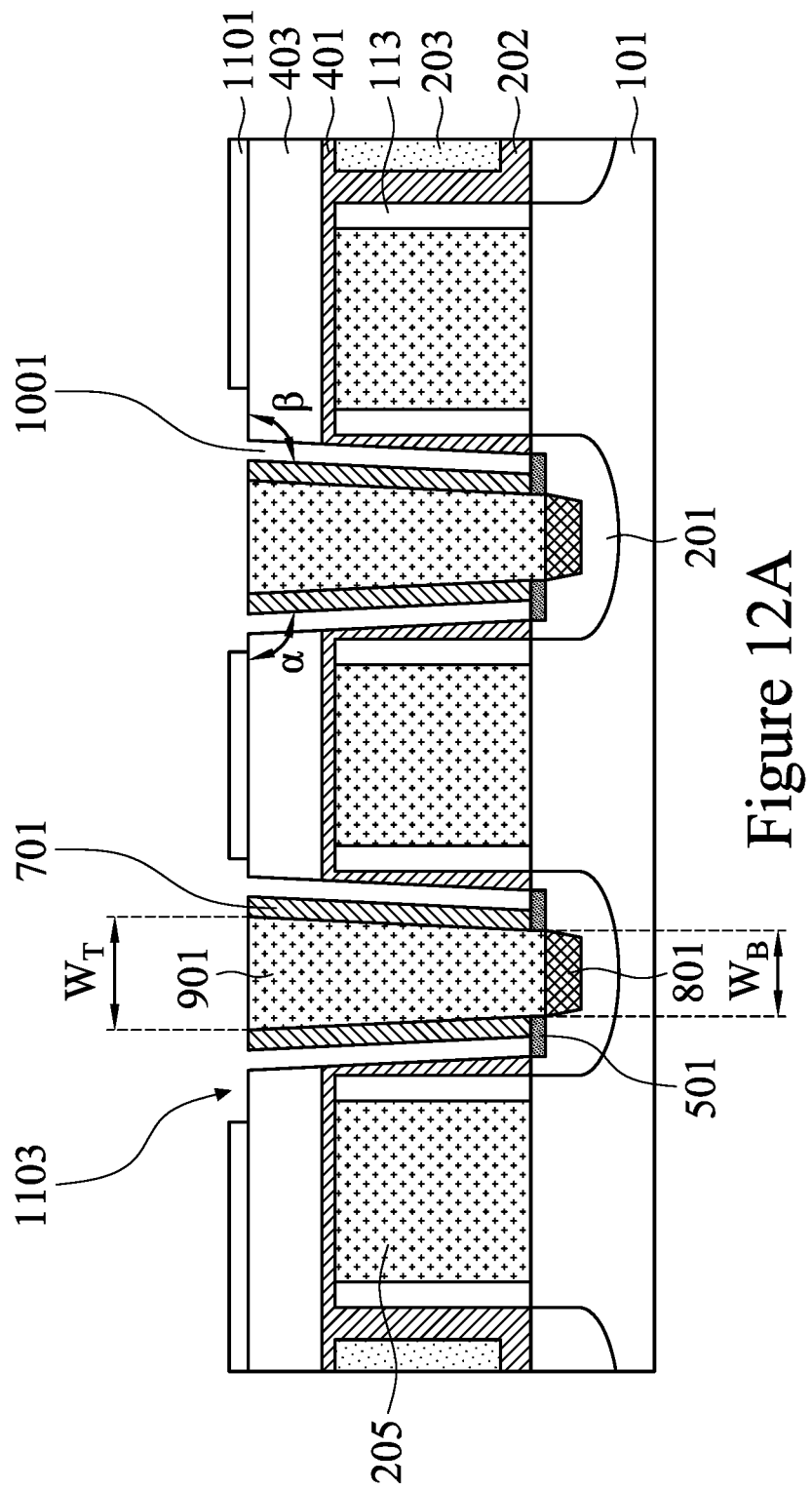
FIGS. 12A-12D illustrate a formation of air gaps with the scaffold in accordance with some embodiments.
Figure 12B:
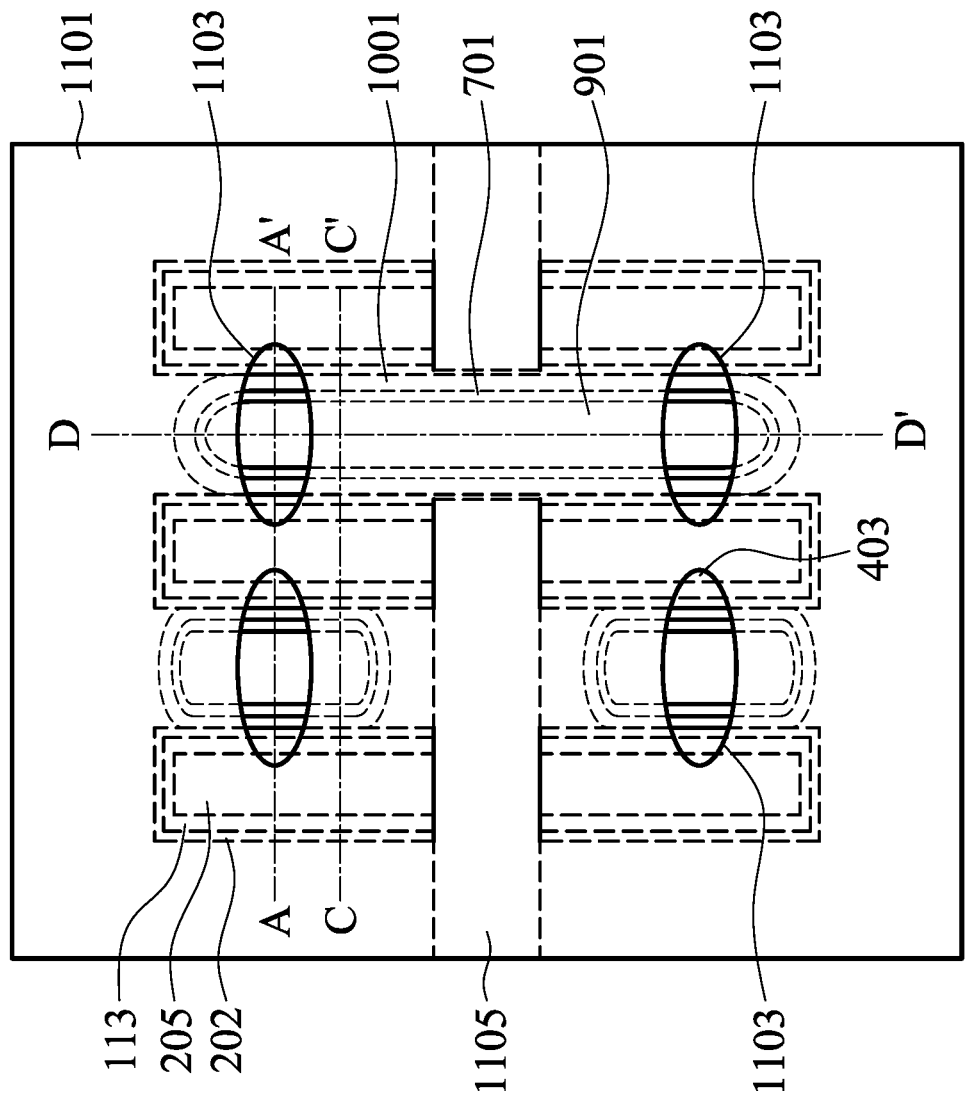
Figure 12C:
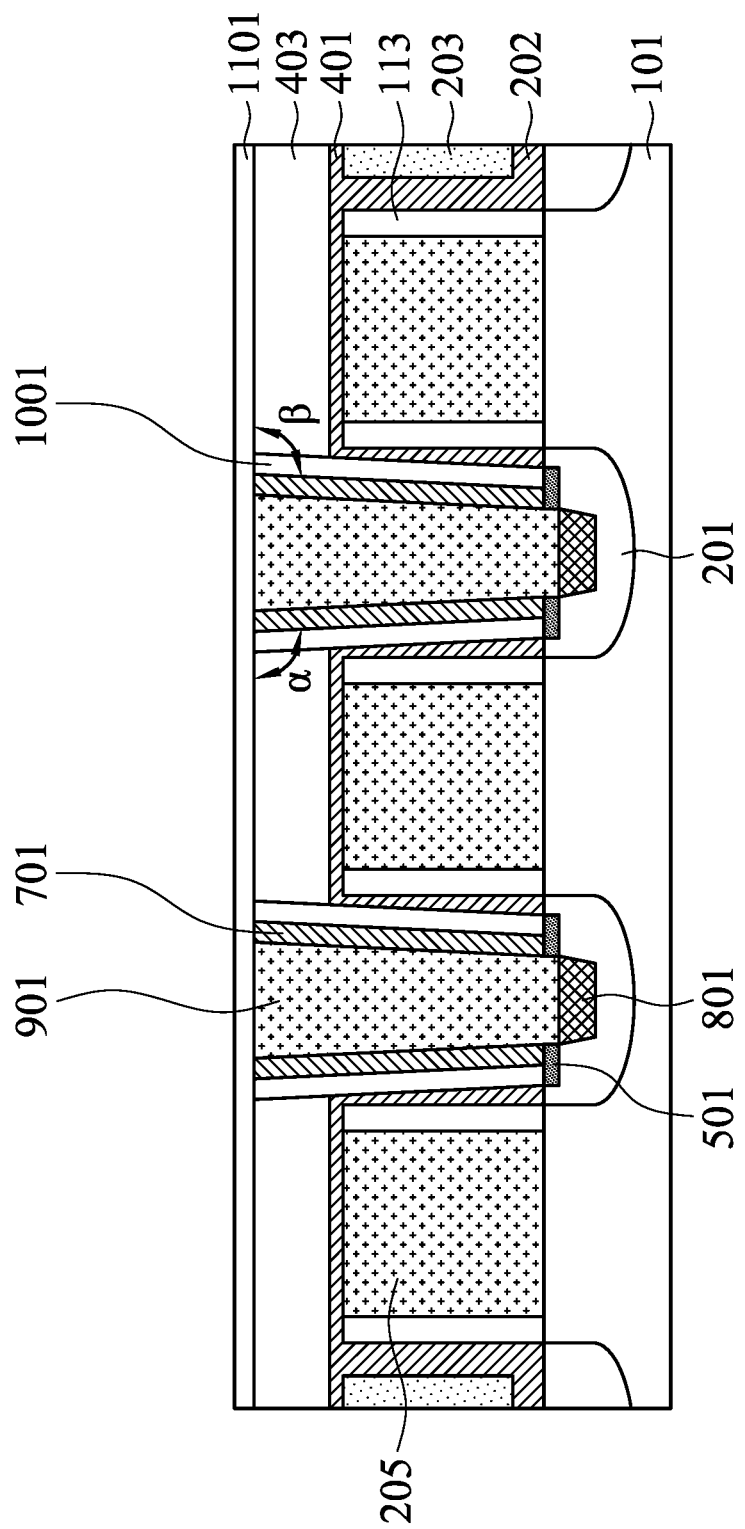

FIGS. 12A-12C illustrate that, once the second openings 1103 have been formed and patterned within the scaffold 1101, the sacrificial spacers 601 may be removed in order to form the air-gaps 1001, with FIG. 12B illustrating a top down view of the structure illustrated in FIG. 12A (wherein FIG. 12A is a cross-sectional view of FIG. 12B through line A-A'), and wherein FIG. 12C illustrates another cross-sectional view along line C-C' as illustrated in FIG. 12B. In an embodiment the formation of the air-gaps 1001 may be performed as described above with respect to FIG. 10A. For example, process may be utilized to make contact through the second openings 1103 and remove the material of the sacrificial spacers 601. However, any suitable method of removing the material of the sacrificial spacers 601 and forming the air-gaps 1001 may be utilized.

However, by forming and patterning the scaffold 1101 prior to the removal of the sacrificial spacers 601, the scaffold 1101 is present during the removal of the sacrificial spacers 601 and can provide additional support to the first contact 901. With the additional support provided by the scaffold 1101, there is less chance of the first contact 901 tilting or otherwise moving during the subsequent processing. As such, with less chance of the first contact 901 moving, there is a smaller chance of defects occurring, thereby increasing the efficiency of the overall manufacturing process.

For example, in an embodiment which uses the scaffold 1101, the first contact 901 may have a first angle α along a first side of the first contact 901 and may also have a second angle β along an opposite side of the first contact 901. With the use of the scaffold 1101, or any of the other embodiments described herein, the first angle α may be equal to the second angle β, and each may be within about −2 to about +2 degrees of each other and, in some embodiments, may have a difference of 0°. Additionally, the first contact 901 may remain at the position in which it was formed (e.g., at a right angle of 90° to a surface of the substrate 101). In other words, the air-gap 1001 may have similar or equal widths on each side of the first contact 901 (e.g., the fourth width $W_4$).

As can be seen in FIG. 12A, after the removal of the material of the sacrificial spacers 601, the air-gaps 1001 that are located under the second openings 1103 are exposed through the second openings 1103. However, as illustrated in FIG. 12C, those portions of the sacrificial spacers 601 that were covered by the scaffold 1101 leave behind air-gaps 1001 which are not exposed but which remain covered by the scaffold 1101. Additionally, in embodiments in which there are multiple second openings 1103 over a single first contact 901, the air-gaps 1001 may extend beneath the scaffold 1101 from a first one of the second openings 1103 to a second one of the second openings 1103.

Figure 12D:
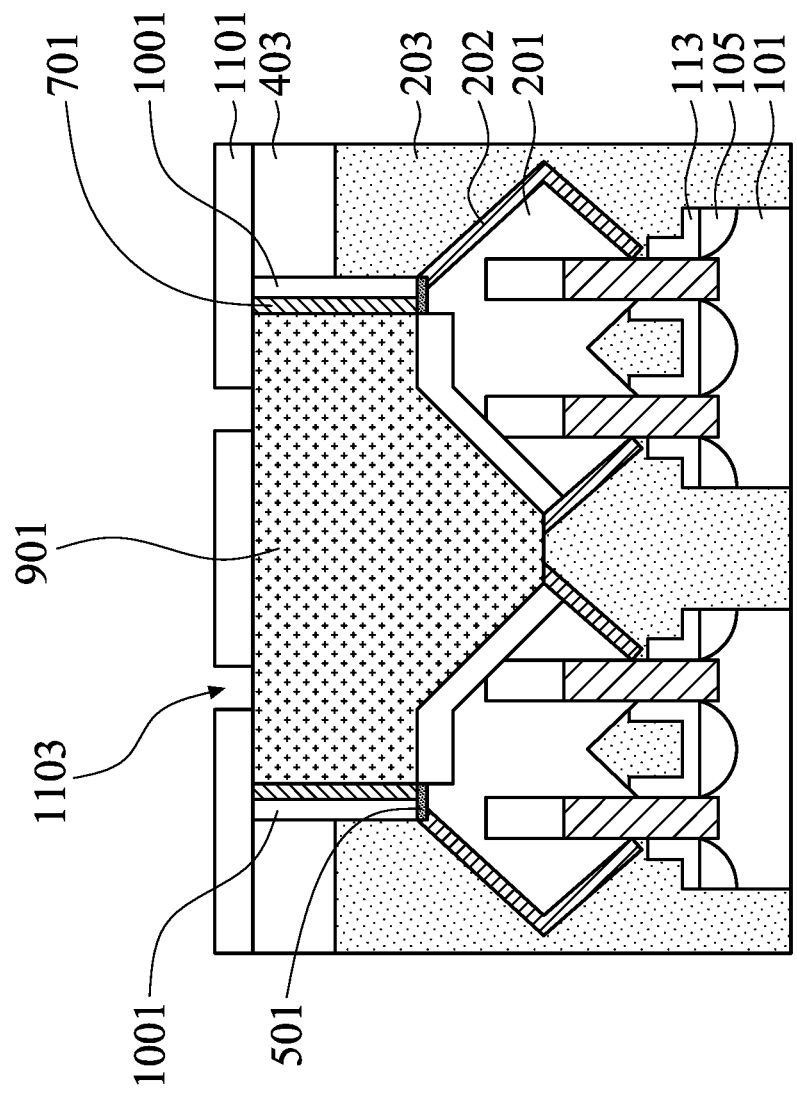

FIG. 12D illustrates a cross-sectional view along line D-D' of FIG. 12B, which illustrates a length-wise view of the first contact 901. As illustrated, the scaffold 1101 is deposited and patterned in order to provide additional structural support for the first contact 901 while still allowing openings for the removal of the material of the sacrificial spacers 601. As such, the air-gaps 1001 may be formed while helping to prevent undesired movement of the first contact 901 which could lead to defects during the manufacturing process.

Figure 13A:
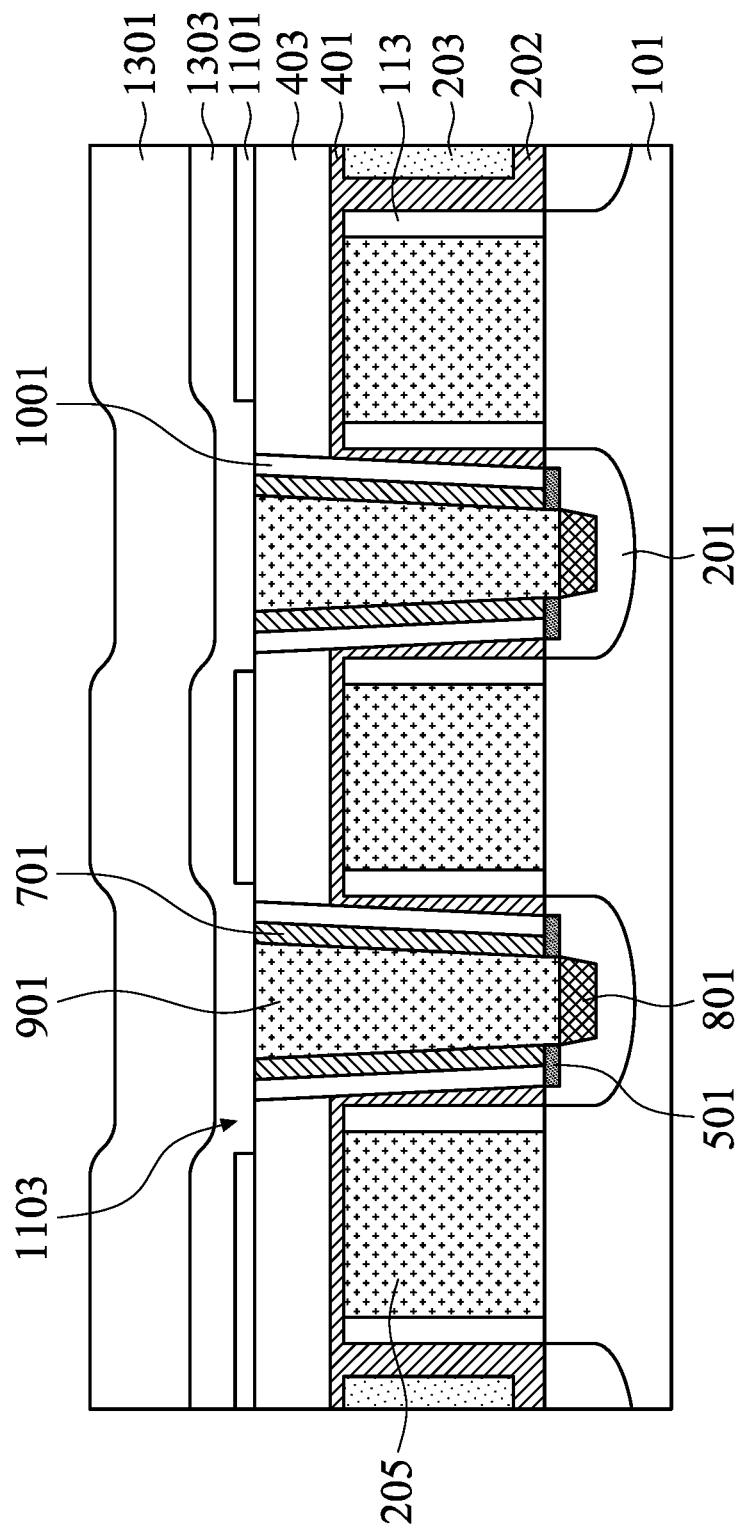
FIGS. 13A-13D illustrate formation of an overlying interlayer dielectric in accordance with some embodiments.
Figure 13B:
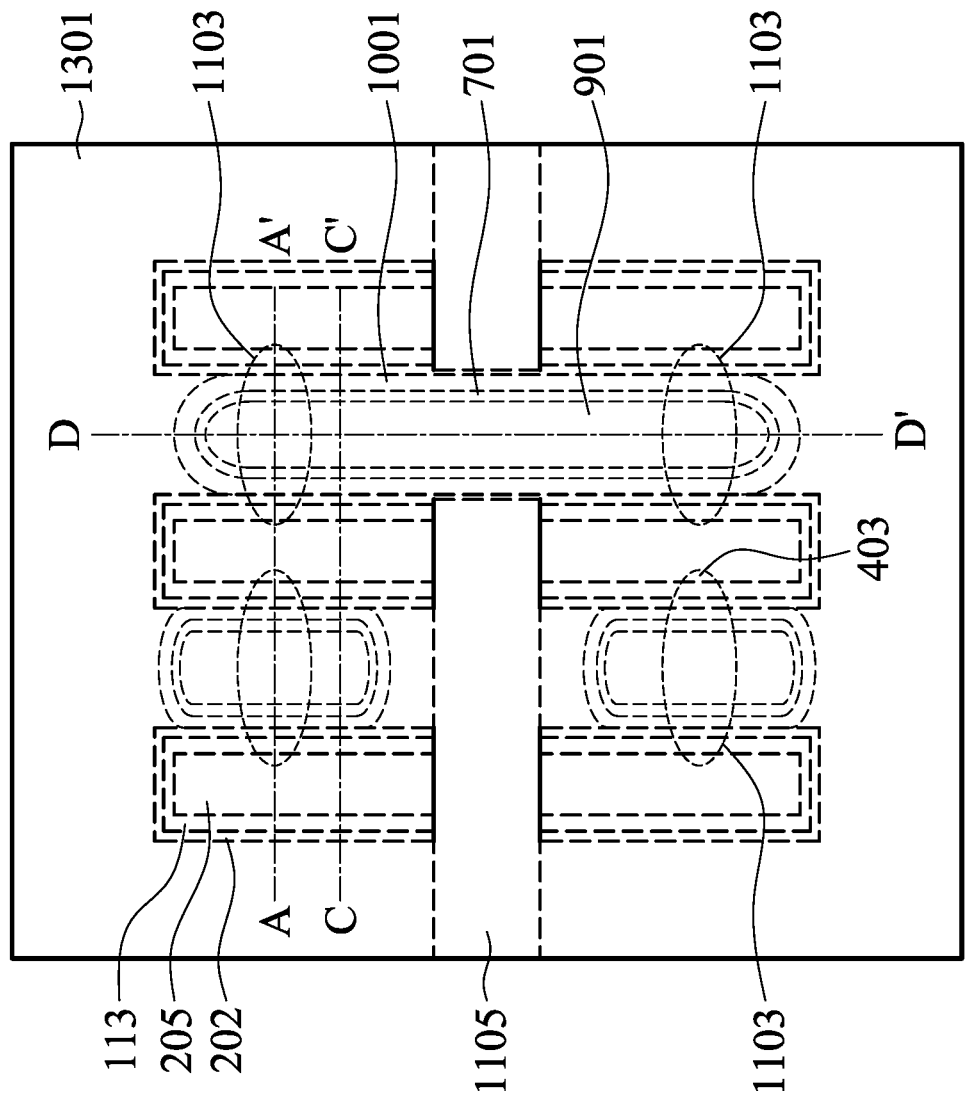
Figure 13C:
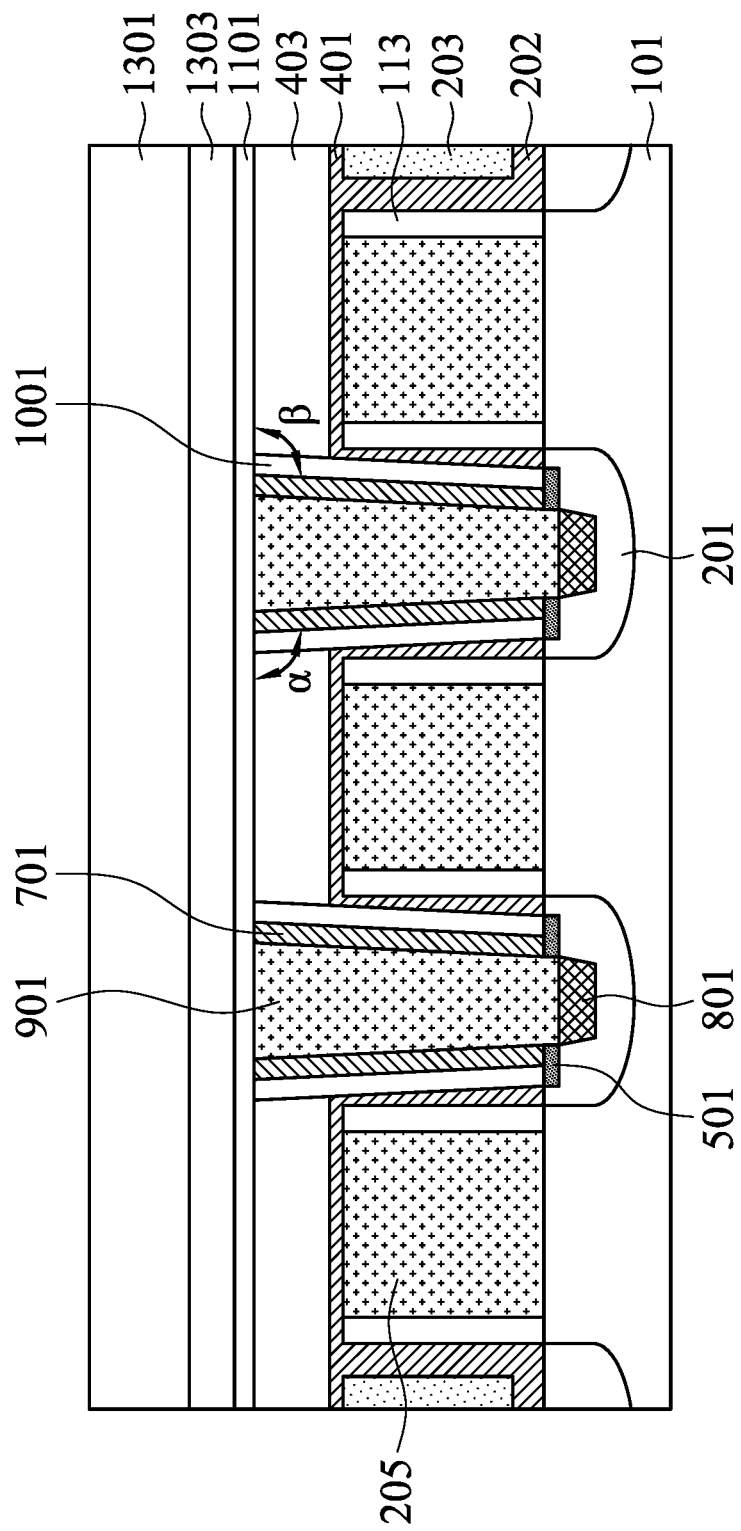
Figure 13D:
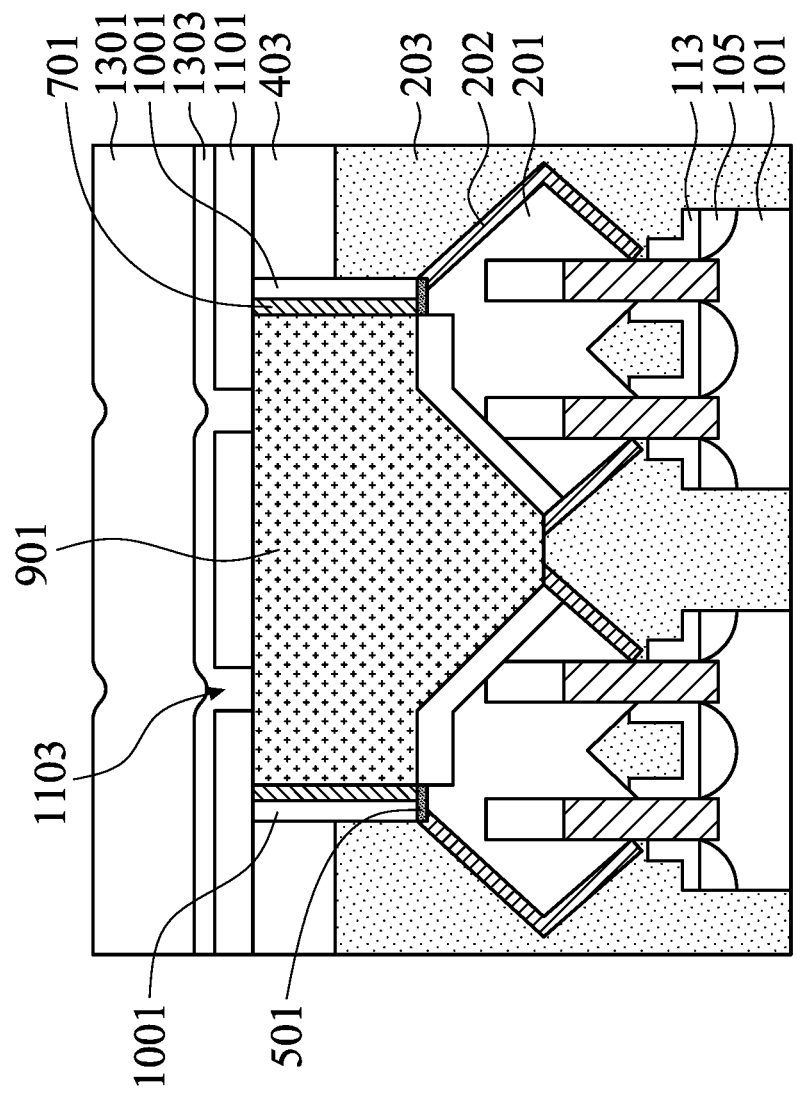

FIGS. 13A-13D illustrate further processing which includes formation of a third etch stop layer 1303 and a third ILD 1301 over the first contact 901, over the second ILD layer 403, and over the scaffold 1101, with FIG. 13B illustrating a top down view of the structure illustrated in FIG. 13A (wherein FIG. 13A is a cross-sectional view of FIG. 13B through line A-A'), wherein FIG. 13C illustrates another cross-sectional view along line C-C' as illustrated in FIG. 13B, and wherein FIG. 13D illustrates yet another cross-sectional view along line D-D' as illustrated in FIG. 13B. In an embodiment the third etch stop layer 1303 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the third etch stop layer 1303, such as low pressure CVD (LPCVD), PVD, or the like, could alternatively be used. The third etch stop layer 1303 may have a thickness of between about 5 Å and about 200 Å or between about 5 Å and about 50 Å.

The third ILD 1301 may comprise an oxide material such as SiON, SiCON, SiC, SiOC, $SiC_xN_y$, $SiO_x$, although any other suitable materials, such as boron phosphorous silicate glass (BPSG), although any suitable dielectrics may be used. The third ILD 1301 may be formed using a process such as PECVD, although other processes, such as LPCVD, may alternatively be used. The third ILD 1301 may be formed to a thickness of between about 100 Å and about 3,000 Å.

As can be seen in FIG. 13A, during the deposition of the third etch stop layer 1303 and the third ILD 1301, the shape of the scaffold 1101 along with the second openings 1103 is not planar. As such, the deposited material of the third etch stop layer 1303 and the third ILD 1301 will also not be planar because of the underlying shape. As such, portions of the third etch stop layer 1303 will dip as the third ILD 1301 moves over the second openings 1103.

However, as can be seen in FIG. 13C, over those portions of the scaffold 1101 in which there is no second opening 1103, the third etch stop layer 1303 and the third ILD 1301 are deposited over a planar surface of the scaffold 1101. As such, those portions of the third etch stop layer 1303 and the third ILD 1301 that are deposited over the planar surface of the scaffold 1101 will also be planar even as the third ILD 1301 extends over the air-gaps 1001.

Additionally, in some embodiments, and as can be seen in FIG. 13D, the third ILD 1301 may also have both planar and non-planar portions as it extends over the first contact 901. In this embodiment, the third ILD 1301 may have a planar surface over those portions of the first contact 901 which are also covered by the scaffold 1101. However, over those portions of the first contact 901 which are not covered by the scaffold 1101 (e.g., where the second openings 1103 are formed), the third ILD 1301 will have a non-planar surface wherein the third ILD 1301 dips into the second openings 1103.

If desired, further processing may be performed while leaving the third ILD 1301 in a planar and non-planar state. However, in other embodiments, the third ILD 1301 may also be planarized prior to additional processing. As such, a planarization process such as chemical mechanical polishing may be utilized in order to planarize the third ILD 1301. Any suitable planarization process may be utilized.

FIG. 12A can also be used to describe another embodiment in which the base layer 501 (even though in FIG. 12A the base layer 501 is illustrated) and the scaffold 1101 are omitted, but in which the first contact 901 still has an enlarged stability. In this embodiment the first contact 901 is formed without the base layer 501, and the first contact 901 is formed with an exaggerated difference between a top width $W_T$ of the first contact 901 and a bottom width $W_B$ of the first contact 901. In some embodiments the top width $W_T$ may be at least 5 nm larger than the bottom width $W_B$, such as the top width $W_T$ being between about 10 nm and about 60 nm, such as about 15 nm, while the bottom width $W_B$ is between about 10 nm and about 60 nm, such as about 13 nm. However, any suitable widths may be utilized.

By increasing the size of the top width $W_T$ relative to the bottom width $W_B$, the overall structure will have an increased stability relative to structures which have a smaller top width $W_T$ relative to the bottom width $W_B$. In particular, by forming a larger top section, the increase in mass from the wider portion will serve to help stabilize the first contact 901 from further processing. As such, the first contact 901 is better able to withstand the stresses and leads to fewer defects and shorts from the first contact 901 moving.

By utilizing one or more of the scaffold 1101, the base layer 501, or the differences in widths of the first contact 901, additional support may be provided to the first contact 901 during and after the removal of the sacrificial spacers 601 and the formation of the air-gaps 1001. By providing additional structural support, the first contact 901 is less likely to shift and move (e.g., tilt) during the processing. By reducing the likelihood that the first contact 901 will move, fewer defects will occur, the effective capacitance can be maintained, there will be fewer shorts, and a more efficient process may be obtained.

Additionally, while the embodiments described herein have been described with respect to a particular embodiment of forming the first contact 901 in physical and electrical connection with the source/drain regions 201, this is intended to be illustrative and is not intended to be limiting to the embodiments. Rather, the ideas presented herein may be utilized in a wide variety of structures. For example, the embodiments may also be implemented in the formation of a contact (e.g., the first contact 901) to the gate stack 205. This and any other suitable embodiments may be utilized, and all such embodiments are fully intended to be included within the scope of the current embodiments.

In accordance with an embodiment, a semiconductor device includes: a first gate stack adjacent to a second gate stack over a semiconductor fin over a substrate; a first contact located between the first gate stack and the second gate stack, the first contact being in electrical connection with a source/drain region, the first contact having a first width located a first distance from the substrate and a second width located a second distance from the substrate greater than the first distance, the second width being between about 10 nm and about 60 nm and the first width being smaller than the second width by an amount greater than zero and less than about 5 nm; and an air gap located between the first contact and the first gate stack. In an embodiment, the semiconductor device further includes a base layer extending away from the first contact and extending below the air gap. In an embodiment, the base layer comprises an oxide material. In an embodiment, the semiconductor device further includes a scaffold material in physical contact with the first contact, the air gap extending from a point uncovered by the scaffold material to a point covered by the scaffold material. In an embodiment, the semiconductor device further includes a spacer between the air gap and the first gate stack, a portion of the first contact extending between the spacer and the source/drain region in a direction perpendicular with a major surface of the substrate. In an embodiment, the first width is smaller than the second width by an amount greater than about 2 nm. In an embodiment the second width is between about 10 nm and about 60 nm.

In accordance with another embodiment, a semiconductor device includes: a first contact in electrical connection with a source/drain region of a fin field effect transistor; a spacer adjacent to the first contact; an air gap located on an opposite side of the spacer from the first contact; a scaffold in physical contact with a first portion of a top surface of the first contact, a second portion of the top surface of the first contact being exposed by the scaffold, wherein the air gap extends under the scaffold; and an etch stop layer capping the air gap, the scaffold being located between the etch stop layer and the second portion of the top surface of the first contact. In an embodiment the semiconductor device further includes a base layer adjacent to a first portion of the first contact, the first contact also having a second portion over the first portion, and a third portion over the second portion, the first portion and the third portion each being wider than the second portion. In an embodiment the base layer extends between the first contact to an etch stop layer, the etch stop layer being located over the source/drain region. In an embodiment the base layer extends beneath the air gap. In an embodiment the source/drain region comprises a silicide material, the silicide material having sidewalls aligned with sidewalls of the base layer. In an embodiment the etch stop layer extends at least partially into the scaffold.

In accordance with yet another embodiment, a method of manufacturing a semiconductor device, the method including: forming a first opening in a dielectric layer to expose a conductive region, the dielectric layer being over a semiconductor fin; forming a base layer within the first opening; forming a sacrificial spacer along sidewalls of the first opening after the forming the base layer; forming a spacer adjacent to the sacrificial spacer; etching the base layer to re-expose the conductive region; depositing a first contact adjacent to the spacer and the base layer; and removing the sacrificial spacer to form an air-gap. In an embodiment the method further includes: forming a scaffold over the first contact prior to the removing the sacrificial spacer; and patterning the scaffold to form at least one second opening through the scaffold, the at least one second opening exposing a first portion of the sacrificial spacer, a second portion of the sacrificial spacer remaining covered by the scaffold after the patterning the scaffold, wherein the removing the sacrificial spacer removes a first part of the sacrificial spacer through the at least one second opening. In an embodiment the patterning the scaffold forms at least two second openings, wherein the removing the sacrificial spacer removes the first part of the sacrificial spacer through a first one of the at least two second openings and wherein the removing the sacrificial spacer removes a second part of the sacrificial spacer through a second one of the at least two second openings. In an embodiment the first contact has a bottom width and a top width larger than the bottom width. In an embodiment the bottom width is smaller than the top width by an amount greater than zero and less than about 5 nm. In an embodiment the method further includes depositing an interlayer dielectric layer to cap the air-gap. In an embodiment the forming the base layer forms the base layer in physical contact with a contact etch stop layer adjacent to a second spacer The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a base layer along an exposed surface of a source/drain region, the exposed surface being exposed through a first dielectric layer;
    forming a second dielectric layer along sidewalls of the first dielectric layer, the second dielectric layer being in physical contact with the base layer;
    forming a third dielectric layer adjacent to the second dielectric layer;
    re-exposing the source/drain region through the base layer;
    depositing a conductive material adjacent to the third dielectric layer;
    depositing a scaffold material in physical contact with both the conductive material and the first dielectric layer; and
    after the depositing the scaffold material, removing the second dielectric layer.

2. The method of claim 1, wherein the base layer comprises an oxide material.

3. The method of claim 1, further comprising patterning the scaffold material to form a first opening and to expose a first portion, but not all of, the second dielectric layer, wherein the removing the second dielectric layer is performed at least in part through the first opening.

4. The method of claim 3, further comprising patterning the scaffold material to form a second opening to expose a second portion, but not all of, the second dielectric layer, wherein the removing the second dielectric layer is performed at least in part through the second opening.

5. The method of claim 1, wherein the forming the third dielectric layer forms the third dielectric layer in physical contact with the base layer.

6. The method of claim 1, wherein the forming the base layer forms a native oxide.

7. The method of claim 1, wherein the forming the base layer comprises at least in part using an ion bombardment with oxygen.

8. A method of manufacturing a semiconductor device, the method comprising:
    depositing a scaffold material onto a first surface, the first surface comprising:
        a first dielectric material;
        a second dielectric material;
        a third dielectric material; and
        a conductive material;
    patterning the scaffold material to expose at least a portion of the second dielectric material; and
    removing at least a portion of the second dielectric material through the scaffold material, the at least the portion of the second dielectric material being located between the first dielectric material and the third dielectric material.

9. The method of claim 8, wherein the removing the at least the portion of the second dielectric material exposes a base layer adjacent to a first portion of the conductive material.

10. The method of claim 9, wherein the base layer extends between the conductive material to an etch stop layer, the etch stop layer being located over a source/drain region.

11. The method of claim 9, further comprising forming a silicide material with sidewalls aligned with sidewalls of the base layer.

12. The method of claim 9, wherein the removing the at least the portion of the second dielectric material forms an air-gap, wherein the air-gap has a first width along a top surface of the air-gap of between about 10 Å and about 60 Å and wherein the air-gap has a second width adjacent to the base layer of between about 10 Å and about 60 Å.

13. The method of claim 12, wherein the first width is between about 20 Å and about 30 Å and wherein the second width is between about 20 Å and about 30 Å.

14. A method of manufacturing a semiconductor device, the method comprising:

supporting a contact by depositing a scaffold in physical contact with the contact, the contact in electrical connection with a source/drain region;

forming a round opening through the scaffold to expose at least one of two spacers located between the contact and a gate stack; and removing one of the two spacers through the round opening to form an air gap.

15. The method of claim 14, wherein the forming the round opening forms at least two round openings, and wherein the removing the one of the two spacers removes the one of the two spacers through both of the at least two round openings.

16. The method of claim 14, further comprising depositing an interlayer dielectric layer to cap the air gap.

17. The method of claim 14, wherein the depositing the scaffold deposits the scaffold to a thickness between about 5 nm and about 10 nm.

18. The method of claim 14, wherein the round opening has a width of between about 10 nm and about 100 nm.

19. The method of claim 18, wherein the round opening has a length of between about 10 nm and about 50 nm.

20. The method of claim 14, wherein the depositing the scaffold deposits silicon nitride.

* * * * *